United States Patent
Ikada

(10) Patent No.: US 11,283,461 B2
(45) Date of Patent: Mar. 22, 2022

(54) SUCCESSIVE APPROXIMATION AD CONVERTER

(71) Applicant: Asahi Kasei Microdevices Corporation, Tokyo (JP)

(72) Inventor: Reijiro Ikada, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 17/206,153

(22) Filed: Mar. 19, 2021

(65) Prior Publication Data

US 2021/0297088 A1 Sep. 23, 2021

(30) Foreign Application Priority Data

Mar. 19, 2020 (JP) .............................. JP2020-049692

(51) Int. Cl.
*H03M 1/46* (2006.01)
*H03M 1/80* (2006.01)

(52) U.S. Cl.
CPC ........... *H03M 1/466* (2013.01); *H03M 1/462* (2013.01); *H03M 1/804* (2013.01)

(58) Field of Classification Search
CPC ...... H03M 1/466; H03M 1/462; H03M 1/804; H03M 1/0612; H03M 1/0682
USPC ...................................................... 341/172
See application file for complete search history.

(56) References Cited

U.S. PATENT DOCUMENTS

| | | | |
|---|---|---|---|
| 10,177,779 B2* | 1/2019 | Lee ...................... | H03M 1/466 |
| 10,291,251 B1* | 5/2019 | Innocent ............. | H03M 1/0692 |
| 2011/0133971 A1 | 6/2011 | Ogawa et al. | |

FOREIGN PATENT DOCUMENTS

JP    S54144858    11/1979

OTHER PUBLICATIONS

J. Craninckx et al., "A 65fJ/Conversion-Step 0-to-50MS/s 0-to-0.7mW 9b Charge-Sharing SAR ADC in 90nm Digital CMOS," 2007 IEEE International Solid-State Circuits Conference. Digest of Technical Papers, Feb. 2007, pp. 1-3.

* cited by examiner

*Primary Examiner* — Khai M Nguyen
(74) *Attorney, Agent, or Firm* — JCIPRNET

(57) ABSTRACT

A successive approximation (SA) AD converter includes a SA control circuit generating a digital output signal based on an output from a comparator; a first capacitor coupled to an input of the comparator, receiving an analog input signal, and capable of storing electric charges; a second and a third capacitor groups coupling to a reference voltage and storing electric charges previously. The SA control circuit operates for each SA step that the second or the third capacitor group is coupled to a non-inverting input of the comparator and the other is coupled to an inverting input of the comparator based on the output from the comparator. The SA control circuit operates that capacitor terminals of the second and the third capacitor groups coupled to the input of the comparator have the same potential when the reference voltage is stored previously in the second and the third capacitor groups.

11 Claims, 22 Drawing Sheets

SUCCESSIVE APPROXIMATION AD CONVERTER

CROSS REFERENCE TO RELATED APPLICATIONS

This application claims the priority benefit of Japanese Patent Application No. 2020-049692, filed on Mar. 19, 2020. The entirety of the above-mentioned patent application is hereby incorporated by reference herein and made a part of this specification.

BACKGROUND

Technical Field

The disclosure relates to a successive approximation AD converter (an analog-digital converter).

Description of Related Art

With advance in IoT technology, it becomes more important to decrease the power consumption of an AD converter of an analog front end which is used for an IF unit with a sensor. A charge sharing type successive approximation AD converter is known as a successive approximation AD converter that can realize a high-speed operation and a decrease in power consumption. For example, Patent Document 1 (Japanese Patent Laid-Open No. S54-144858) and Non-Patent Document 1 (J. Craninckx, Geert Van der Plas, "A 65fJ/Conversion-Step 0-to-50MS/s 0-to-0.7 mW 9b Charge-Sharing SAR ADC in 90 nm Digital CMOS," ISSCC Dig. Tech. Papers, pp. 246-247, February 2007) are recommended as references. On the other hand, a successive approximation AD converter according to the related art is referred to as a charge redistribution type successive approximation AD converter.

As illustrated in FIG. 1, a charge redistribution type successive approximation AD converter 300 includes a capacitor 33 that samples an input voltage, a comparator, and a successive approximation control circuit, and selects a reference voltage or a ground as a connection destination of the capacitor 33 for each successive approximation step.

On the other hand, as illustrated in FIG. 2, a charge sharing type successive approximation AD converter 200 is characterized in that a capacitor 31 that samples an input voltage in advance and a capacitor 91 that samples a reference voltage are configured as different capacitors. For example, in Patent Document 1, C3 in FIG. 1 is a capacitor that samples an input voltage in advance and C1 and C2 are capacitors that sample a reference voltage. In Non-Patent Document 1, Csp and Csn in FIG. 13.5.1 are capacitors that sample an input voltage in advance and Cu is a capacitor that samples a reference voltage. Regarding the reference voltage, an operation of storing electric charges in the capacitor 91 is performed only once at the same time as sampling the input voltage.

By employing these configurations and operations, a charge sharing type successive approximation AD converter does not have to perform settling of the reference voltage on the capacitor every N times of a comparison timing (in a case of an AD converter of N bits) and thus it is possible to reduce a burden on an operational amplifier that drives the reference voltage. Accordingly, it is known that a high-speed operation and a decrease in power consumption are possible in comparison with a charge redistribution type successive approximation AD converter.

A charge sharing type successive approximation AD converter according to the related art will be described below with reference to FIG. 3. FIG. 3 is a diagram illustrating an example of a configuration of a charge sharing type successive approximation AD converter according to the related art. The charge sharing type successive approximation AD converter 200 according to the related art includes a successive approximation control circuit 11, a comparator 21, a first capacitor 31 that is able to couple to an analog input signal, and a second capacitor group 91 that is able to couple to a reference voltage in advance. The second capacitor group 91 includes a plurality of capacitive elements which is weighted. The first capacitor 31 is coupled to an input of the comparator 21. The successive approximation control circuit 11 couples the weighted second capacitor group 91 to an input of the comparator 21 with a predetermined polarity or the opposite polarity thereof based on a determination output result from the comparator 21 for each successive approximation step. FIG. 3 illustrates an example in which the analog input signal is a differential input signal and, for example, the same configuration can be applied to a single end signal illustrated in FIG. 3 of Patent Document 2 (Japanese Patent Laid-Open No. 2011-120011).

Circuit operations of the charge sharing type successive approximation AD converter 200 will be sequentially described below for each successive approximation step with reference to FIGS. 4 to 7. For the purpose of simplification, an example of an operation of a charge sharing type successive approximation AD converter 200 of 3 bits will be described.

FIG. 4 is a diagram illustrating a state in a sampling phase before a successive approximation operation is performed. As illustrated in FIG. 4, in the sampling phase, an analog input is coupled to the first capacitor 31 via a switch 61, and electric charges corresponding to an analog input voltage are stored in the capacitor 31. On the other hand, a reference voltage is coupled to the second capacitor group 91 via a switch 71 and electric charges corresponding to the reference voltage is stored in the second capacitor group 91 in advance.

More specifically, when an analog input voltage is a differential input voltage expressed by $Vin_{inp}-V_{inn}$, electric charges of $Q_p=-8CV_{inn}$ and $Q_n=-8CV_{inp}$ are stored in the capacitors 31 coupled to a P-side input terminal and an N-side input terminal of the comparator 21. On the other hand, electric charges of $Q_{ref92}=2CV_{ref}$ are stored in a capacitive element with a greatest weight in the second capacitor group 91, and electric charge of $Q_{ref92}=2CV_{ref}$ are stored in a capacitive element with a second greatest weight in the second capacitor group 91.

FIG. 5 is a diagram illustrating a state at the time of determining a most significant bit. As illustrated in FIG. 5, a terminal of the first capacitor 31 which is not coupled to the comparator 21 is coupled to a voltage which is to be a common voltage of the comparator 21. In FIG. 5, for example, the terminal is coupled to the ground. At this time, when potentials of positive and negative input terminals of the comparator 21 are $V_p$ and $V_n$, a differential input voltage of the comparator 21 is $V_p-V_n=V_{inp}-V_{inn}$. When $V_{inp}-V_{inn}=0.3V_{ref}$ is supposed, the input voltage of the comparator 21 is $V_p-V_n=V_{inp}-V_{inn}=0.3V_{ref}>0$, the comparator 21 generates "1," and the most significant bit is determined to be "1."

FIG. 6 is a diagram illustrating a state at the time of determining a second high-order bit. As illustrated in FIG. 6, the most significant bit is "1", thus a capacitive element with a greatest weight in the second capacitor group 91 is coupled to the input of the comparator 21 with a predetermined polarity via a switch 81. More specifically, electric charges of $-2CV_{ref}$ are applied to the non-inverting input terminal (hereinafter referred to as a P-side input terminal) of the comparator 21 and electric charges of $+2CV_{ref}$ is applied to an inverted input terminal (hereinafter referred to as an N-side input terminal) of the comparator 21.

Accordingly, a total sum of the electric charges $Q_p$ in the P-side input terminal of the comparator 21 and a total sum of the electric charges $Q_n$ in the N-side input terminal of the comparator 21 are $Q_p=-8CV_{inn}-2CV_{ref}$ and $Q_n=-8CV_{inp}+2CV_{ref}$, respectively. The input voltage of the comparator 21 is $V_p-V_n=\{8C(V_{inp}-V_{inn})-4CV_{ref}\}/12C=2/3\{(V_{inp}-V_{inn})-0.5V_{ref}\}$. Here, since $V_{inp}-V_{inn}=0.3V_{ref}$ is supposed, $V_p-V_n=2/3\{0.3V_{ref}-0.5V_{ref}\}<0$ is satisfied, the comparator 21 generates "0," and the second high-order bit is determined to be "0."

FIG. 7 is a diagram illustrating a state at the time of determining a third high-order bit. As illustrated in FIG. 7, the second high-order bit is "0", thus a capacitive element with a second greatest weight in the second capacitor group 91 is coupled to the input of the comparator 21 with a polarity opposite to the predetermined polarity via the switch 81. More specifically, electric charges of $+CV_{ref}$ are applied to the P-side input terminal of the comparator 21 and electric charges of $-CV_{ref}$ are applied to the N-side input terminal of the comparator 21. At this time, the capacitive element with the greatest weight in the second capacitor group 91 which is coupled at the time of determining the second high-order bit is kept coupled to the input of the comparator 21.

Accordingly, a total sum of the electric charges $Q_p$ in the P-side input terminal of the comparator 21 and a total sum of the electric charges $Q_n$ in the N-side input terminal of the comparator 21 are $Q_p=-8CV_{inn}-2CV_{ref}+CV_{ref}=-8CV_{inn}-CV_{ref}$ and $Q_n=-8CV_{inp}+2CV_{ref}-CV_{ref}=-8CV_{inp}+CV_{ref}$, respectively. The input voltage of the comparator 21 is $V_p-V_n=\{8C(V_{inp}-V_{inn})-2CV_{ref}\}/14C=4/7\{(V_{inp}-V_{inn})-0.25V_{ref}\}$. Here, since $V_{inp}-V_{inn}=0.3V_{ref}$ is supposed, $V_p-V_n=4/7\{0.3V_{ref}-0.25V_{ref}\}>0$ is satisfied, the comparator 21 generates "1," and the third high-order bit is determined to be "1."

Through a series of successive approximation steps described above and illustrated in FIGS. 4 to 7, the analog input signal $V_{inp}-V_{inn}=0.3V_{ref}$ is converted to a digital output "101" in an analog-digital conversion manner.

However, in the charge sharing type successive approximation AD converter according to the related art, when a parasitic capacitor is present at both ends of a capacitor group (the second capacitor group) that stores the reference voltage in advance, electric charges are stored in the parasitic capacitors. The charge sharing type successive approximation AD converter can achieve a decrease in power consumption, but linearity of the AD converter deteriorates for that reason and there is a problem in that an AD converter with high accuracy cannot be realized.

Problems of the charge sharing type successive approximation AD converter according to the related art will be described below with reference to FIG. 8. As illustrated in FIG. 8, a parasitic capacitor due to a structure of a capacitive element as well as a parasitic capacitor due to a switch is normally present at both ends of each capacitive element of the second capacitor group 91. In such a type of capacitive element in which thin films are stacked in an integrated circuit such as an LSI, the parasitic capacitors on and under the capacitive element have different capacitance values. As illustrated in FIG. 8, when it is assumed that $C_{p1}$ and $C_{p2}$ are added as parasitic capacitors to both ends of each capacitive element of the second capacitor group 91, electric charges of $Q_{refp2}=2CV_{ref}$ is stored in the capacitive element with a greatest weight in the second capacitor group 91, and $\Delta Q_1=C_{p1}\cdot V_{ref}$ and $\Delta Q_2=C_{p2}\cdot 0=0$ are stored in $C_{p1}$ and $C_{p2}$, respectively, in the sampling phase.

Thereafter, determination of the most significant bit is not affected by the parasitic capacitors. On the other hand, determination of the second high-order bit is affected by the parasitic capacitors.

This will be more specifically described below with reference to FIG. 9. Electric charges $Q_p$ at the P-side input terminal of the comparator 21 and electric charges $Q_n$ at the N-side input terminal of the comparator 21 at the time of determining the second high-order bit are $Q_p=-8CV_{inn}-2CV_{ref}$ and $Q_n=-8CV_{inp}+2CV_{ref}+C_{p1}V_{ref}$, respectively. When $C_{p1}=C_{p2}=Cp$ is supposed for the purpose of simplification in the following description, the input voltage of the comparator 21 is $V_p-V_n=\{8C(V_{inp}-V_{inn})-4CV_{ref}+C_p(V_{inp}-V_{inn})-(3Cp/2)V_{ref}-(0.125C_p^2/C)V_{ref}\}/(12C+2.5Cp+0.125(C_p^2/C))$.

As can be seen from comparison with the original expression, terms which are added in consideration of the parasitic capacitors in the second capacitor group are components serving as a gain error and an offset error in determining the output of the comparator 21, and linearity of the AD converter deteriorates and thus accuracy is decreased because the terms vary for every bit determination.

SUMMARY

The disclosure provides a successive approximation AD converter that can perform AD conversion with high accuracy even when a parasitic capacitor is present in the second capacitor group.

A successive approximation AD converter according to the disclosure includes a comparator, a successive approximation control circuit that generates a digital output signal based on a determination output result from the comparator, a first capacitor that is coupled to an input terminal of the comparator, is configured to be able to couple to an analog input signal, and is able to store electric charges in advance, and a second capacitor group and a third capacitor group that are configured to be able to couple to a reference voltage and are able to store electric charges in advance. The successive approximation control circuit performs control for each successive approximation step such that one of the second capacitor group and the third capacitor group is coupled to a non-inverting input terminal of the comparator and the other one of the second capacitor group and the third capacitor group is coupled to an inverting input terminal of the comparator based on the determination output result from the comparator for each successive approximation step. The successive approximation control circuit is configured such that a capacitor terminal of the second capacitor group and a capacitor terminal of the third capacitor group which are coupled to the input terminal of the comparator have the same potential when electric charges corresponding to the reference voltage is stored in advance in the second capacitor group and the third capacitor group.

The summary of the disclosure does not include all features of the disclosure. Sub-combinations of the features can describe the disclosure.

According to the disclosure, it is possible to provide a successive approximation AD converter that can perform AD conversion with high accuracy even when a parasitic capacitor is present in the second capacitor group.

DESCRIPTION OF THE EMBODIMENTS

Hereinafter, the disclosure will be described with reference to embodiments. The following embodiments are not intended to limit the configurations described in the appended claims. All combinations of features described in the embodiments cannot be said to be essential to solutions of the invention.

First Embodiment

Figure 1:
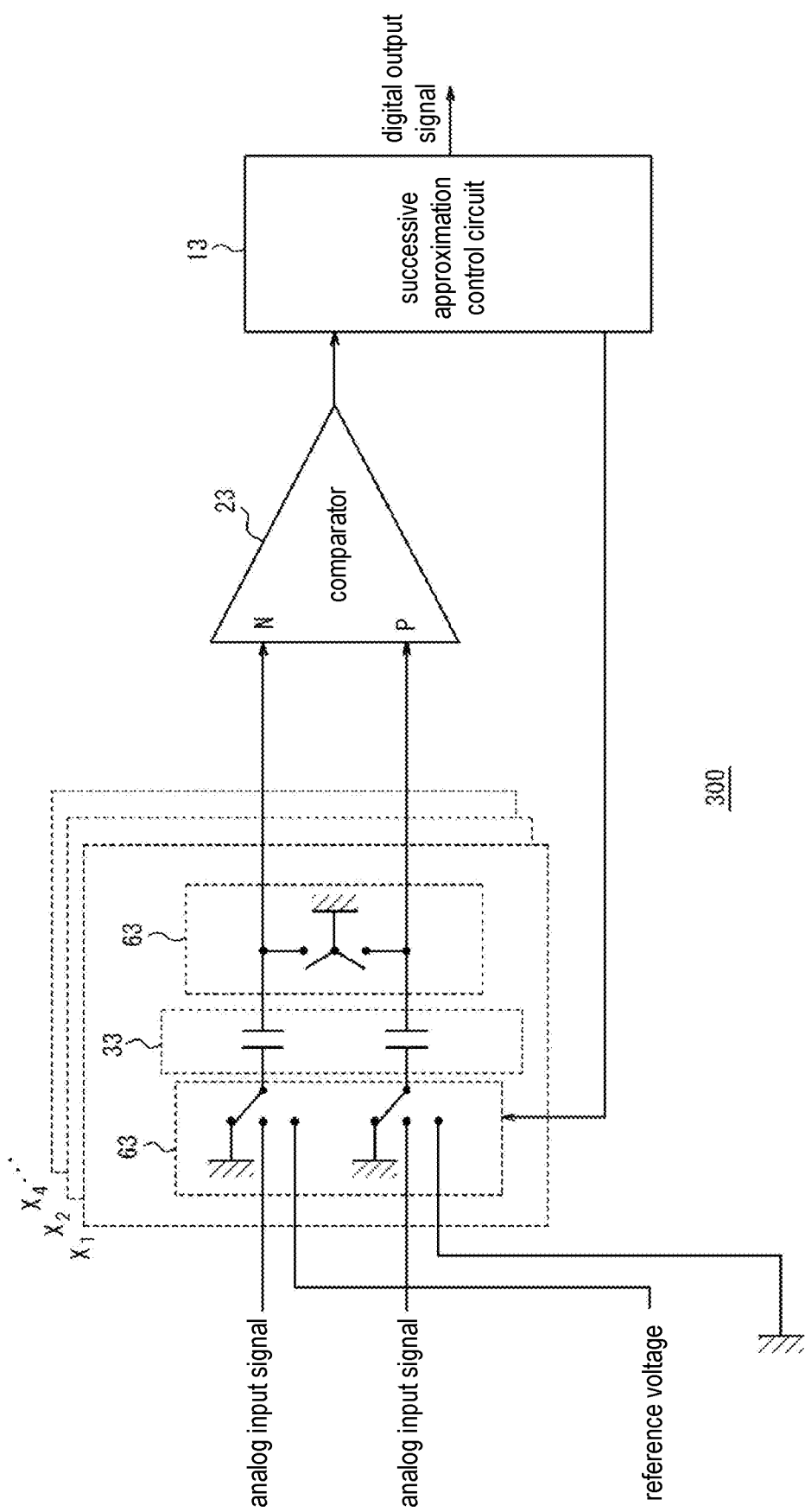
FIG. 1 is a diagram schematically illustrating a configuration of a charge redistribution type successive approximation AD converter according to the related art.
Figure 2:
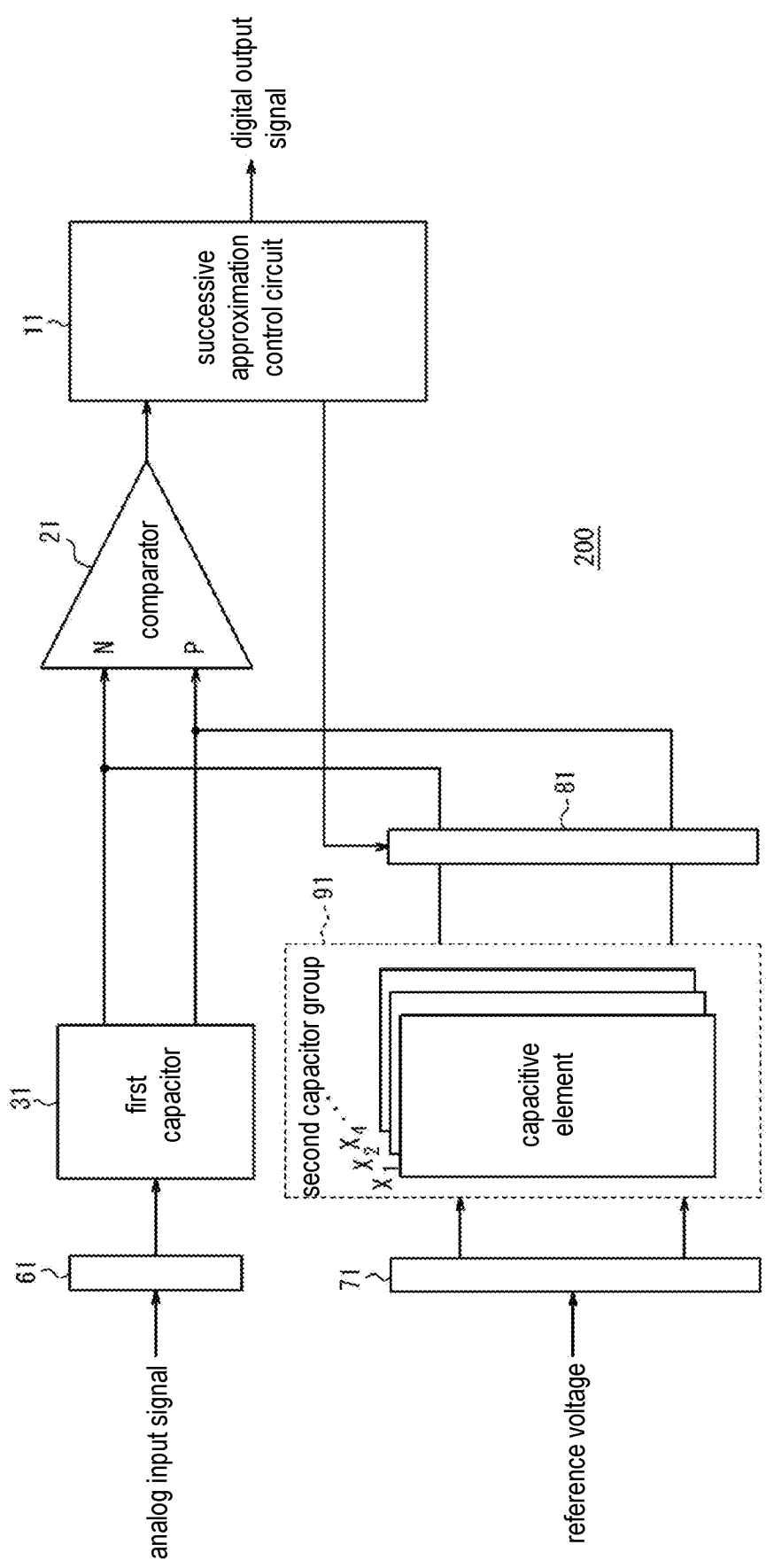
FIG. 2 is a diagram schematically illustrating a configuration of a charge sharing type successive approximation AD converter according to the related art.
Figure 3:
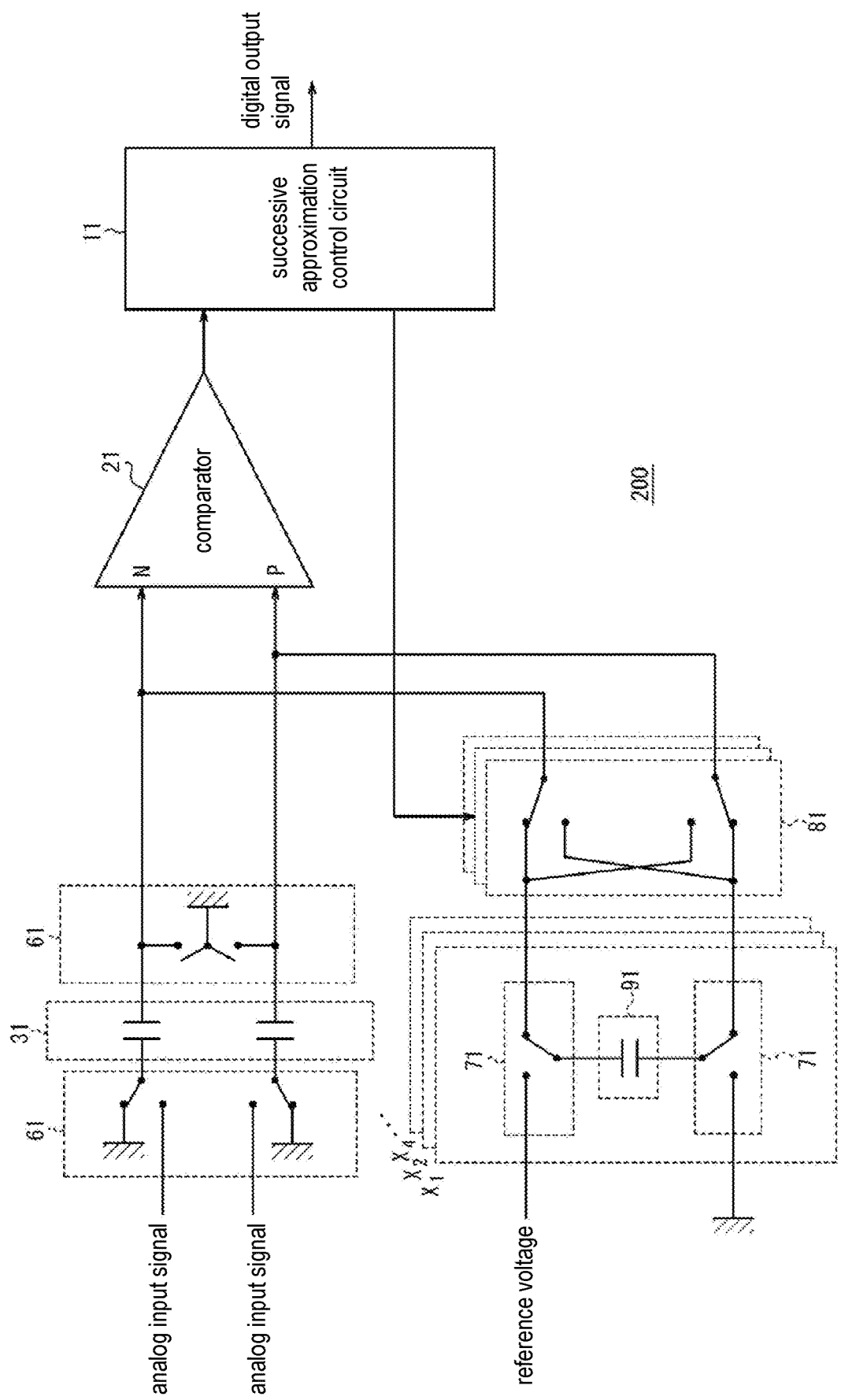
FIG. 3 is a diagram illustrating an example of a configuration of the charge sharing type successive approximation AD converter according to the related art.
Figure 4:
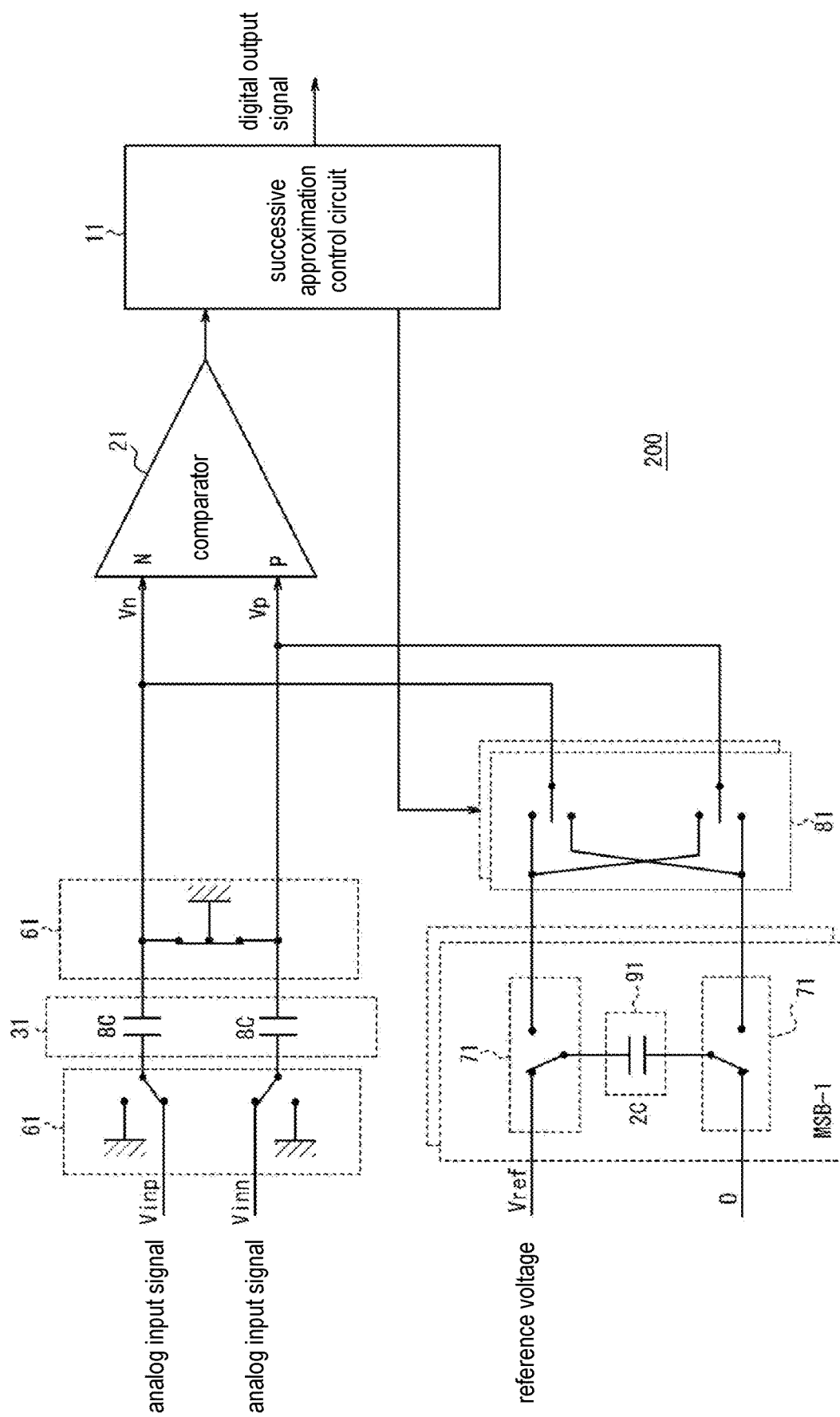
FIG. 4 is a diagram illustrating an example of an operation of a sampling phase in the charge sharing type successive approximation AD converter according to the related art.
Figure 5:
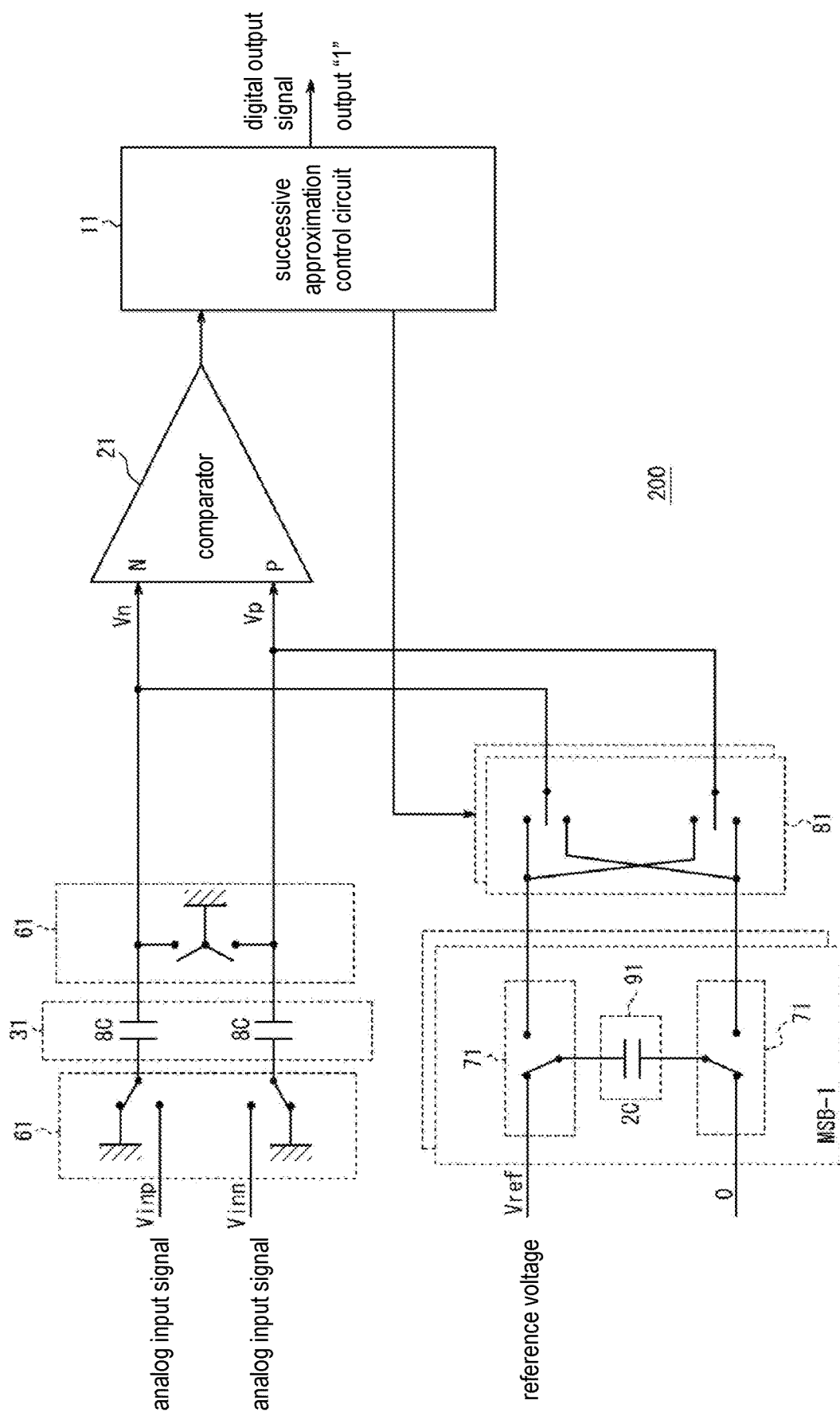
FIG. 5 is a diagram illustrating an example of an operation at the time of determining a most significant bit in the charge sharing type successive approximation AD converter according to the related art.
Figure 6:
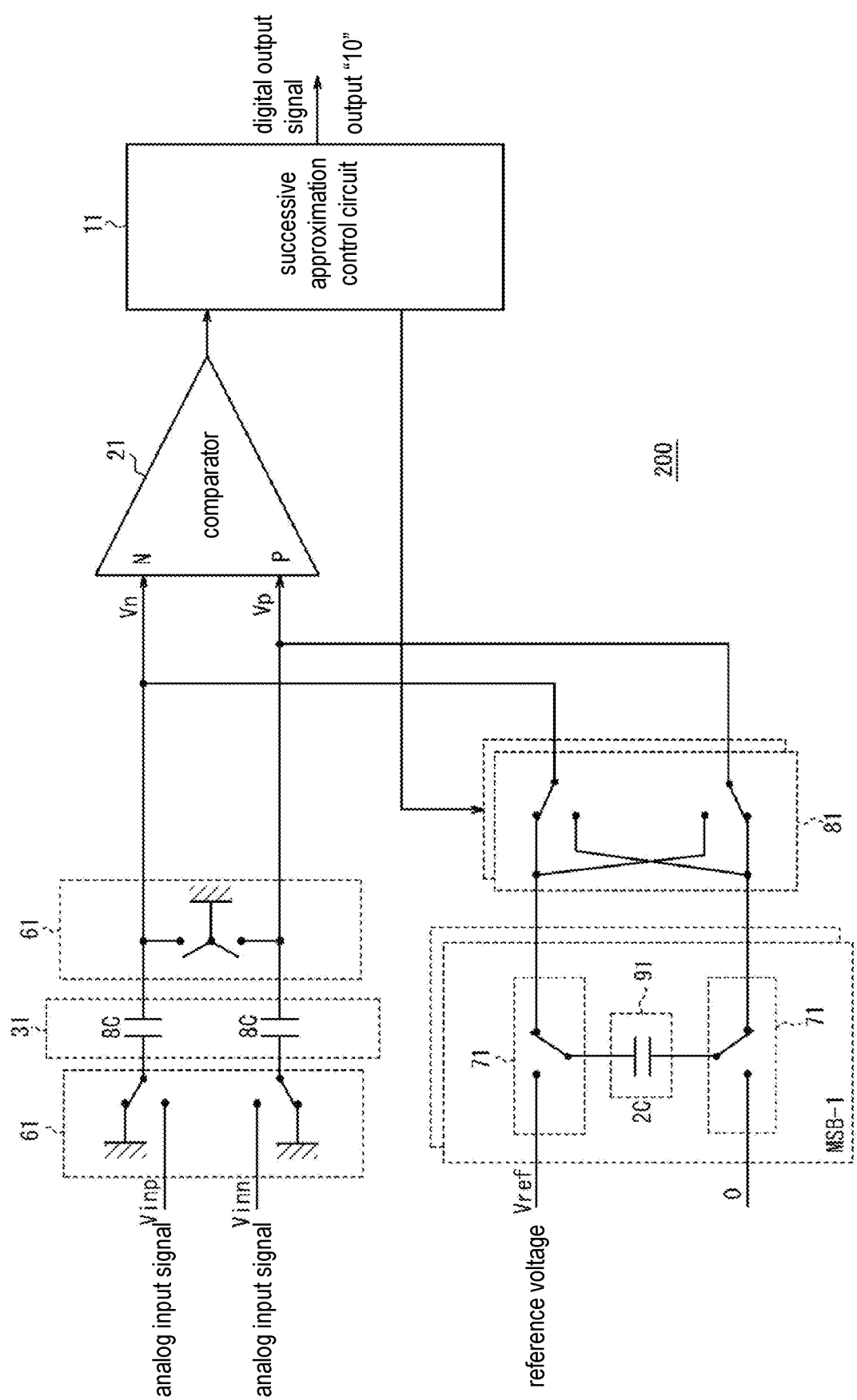
FIG. 6 is a diagram illustrating an example of an operation at the time of determining a second high-order bit in the charge sharing type successive approximation AD converter according to the related art.
Figure 7:
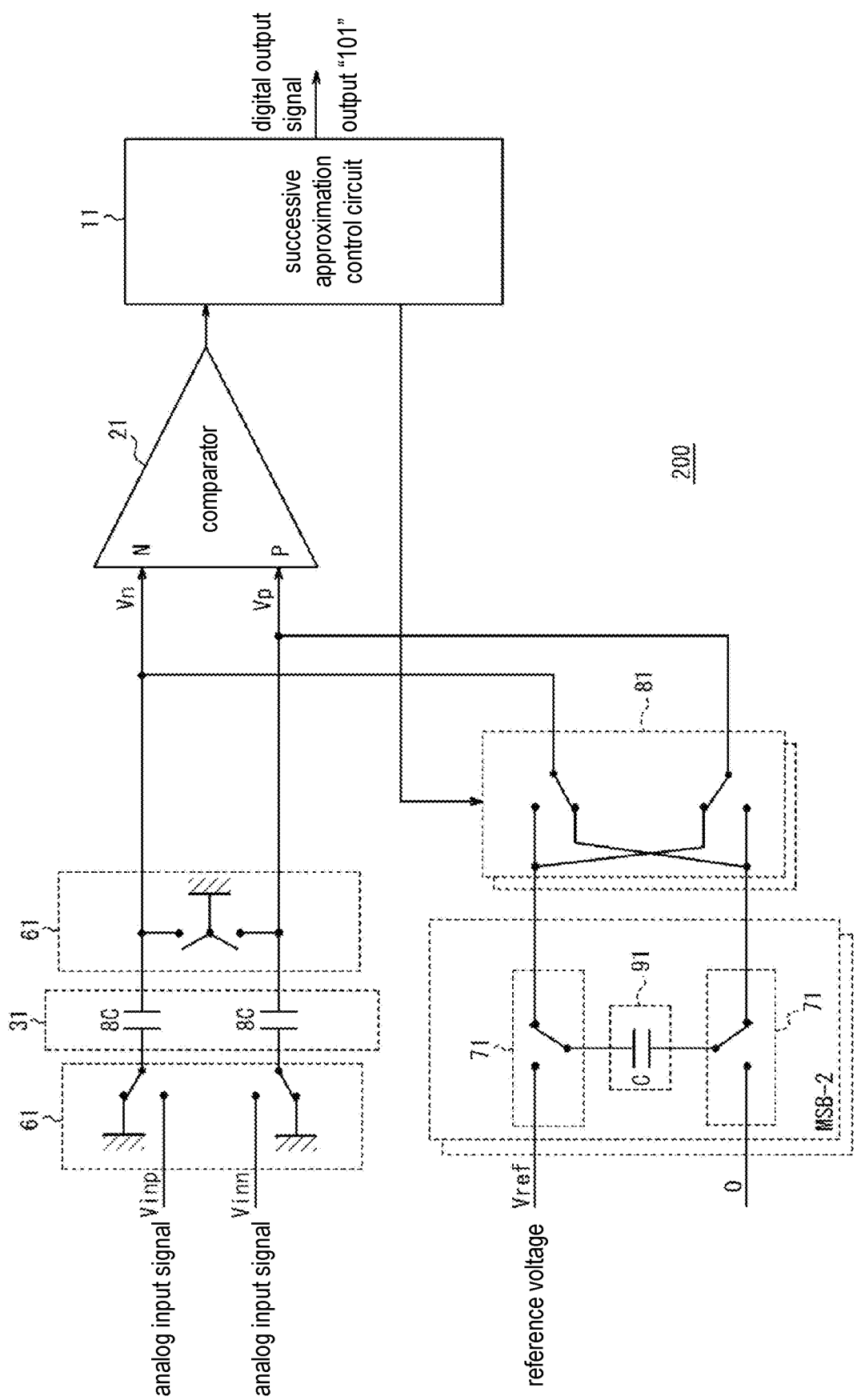
FIG. 7 is a diagram illustrating an example of an operation at the time of determining a third high-order bit in the charge sharing type successive approximation AD converter according to the related art.
Figure 8:
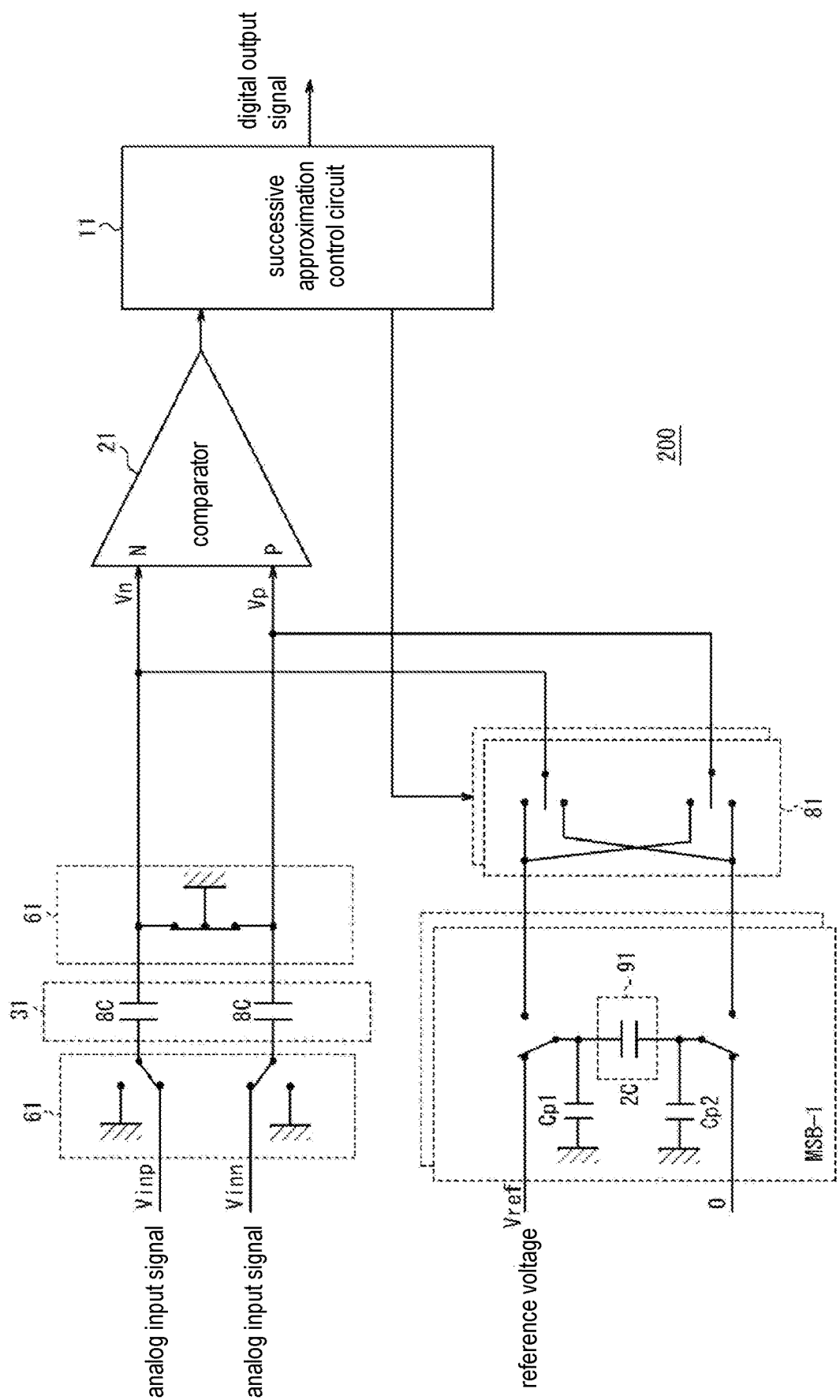
FIG. 8 is a diagram illustrating problems of the sampling phase in the charge sharing type successive approximation AD converter according to the related art.
Figure 9:
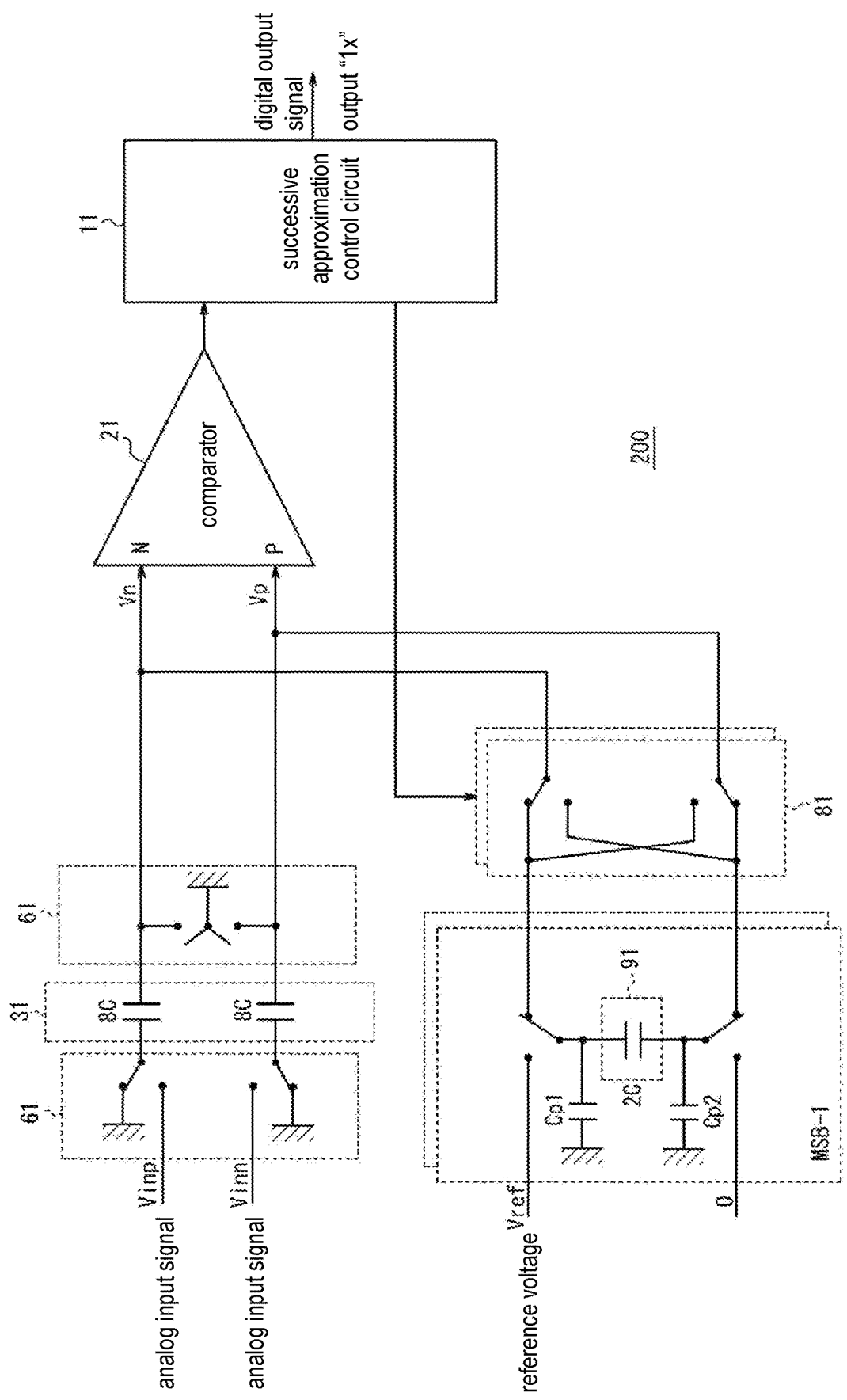
FIG. 9 is a diagram illustrating problems at the time of determining a second high-order bit in the charge sharing type successive approximation AD converter according to the related art.
Figure 10:
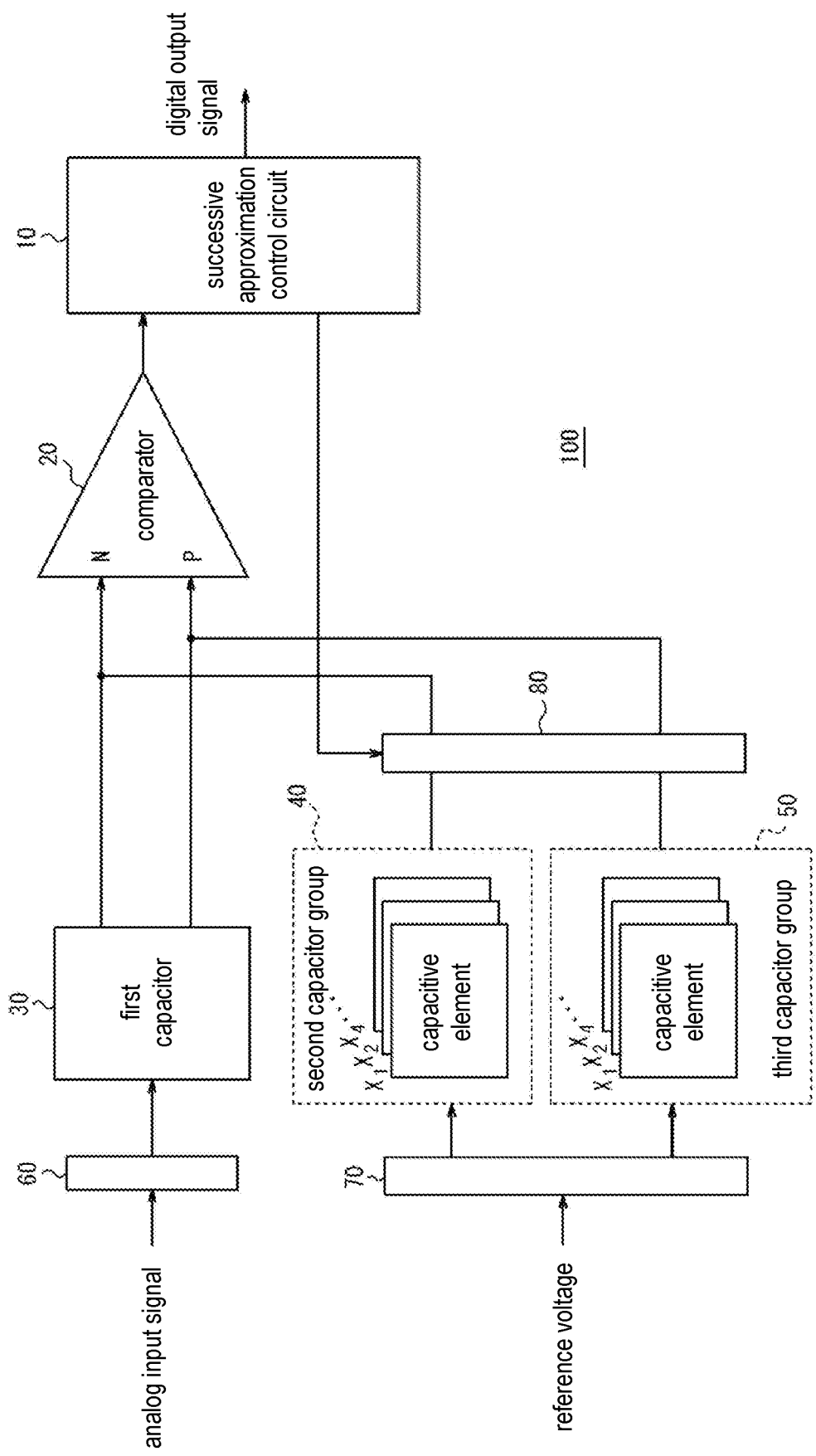
FIG. 10 is a diagram schematically illustrating a configuration of a successive approximation AD converter according to a first embodiment.

An embodiment of the disclosure will be described below with reference to FIG. 10. FIG. 10 is a diagram schematically illustrating a configuration of a successive approximation AD converter according to a first embodiment. The successive approximation AD converter 100 is a charge sharing type successive approximation AD converter and includes a successive approximation control circuit 10, a comparator 20, a first capacitor 30 that is coupled to an input terminal of the comparator 20, is configured to be able to couple to an analog input signal, and is able to store electric charges in advance, and a second capacitor group 40 and a third capacitor group 50 that are configured to be able to couple to a reference voltage and are able to store electric charges in advance. The second capacitor group 40 and the third capacitor group 50 include a plurality of capacitive elements which is weighted (for example, weighted with a power of 2). The first capacitor 30 is coupled to an input terminal of the comparator 20.

The successive approximation control circuit 10 performs controls for each successive approximation step such that one of the second capacitor group 40 and the third capacitor group 50 which are weighted is coupled to a P-side input terminal of the comparator 20 and the other is coupled to an N-side input terminal of the comparator 20 based on a determination output result from the comparator 20 for each successive approximation step, and sets the determination output result from the comparator 20 which is sequentially determined as a digital output signal.

Figure 11:
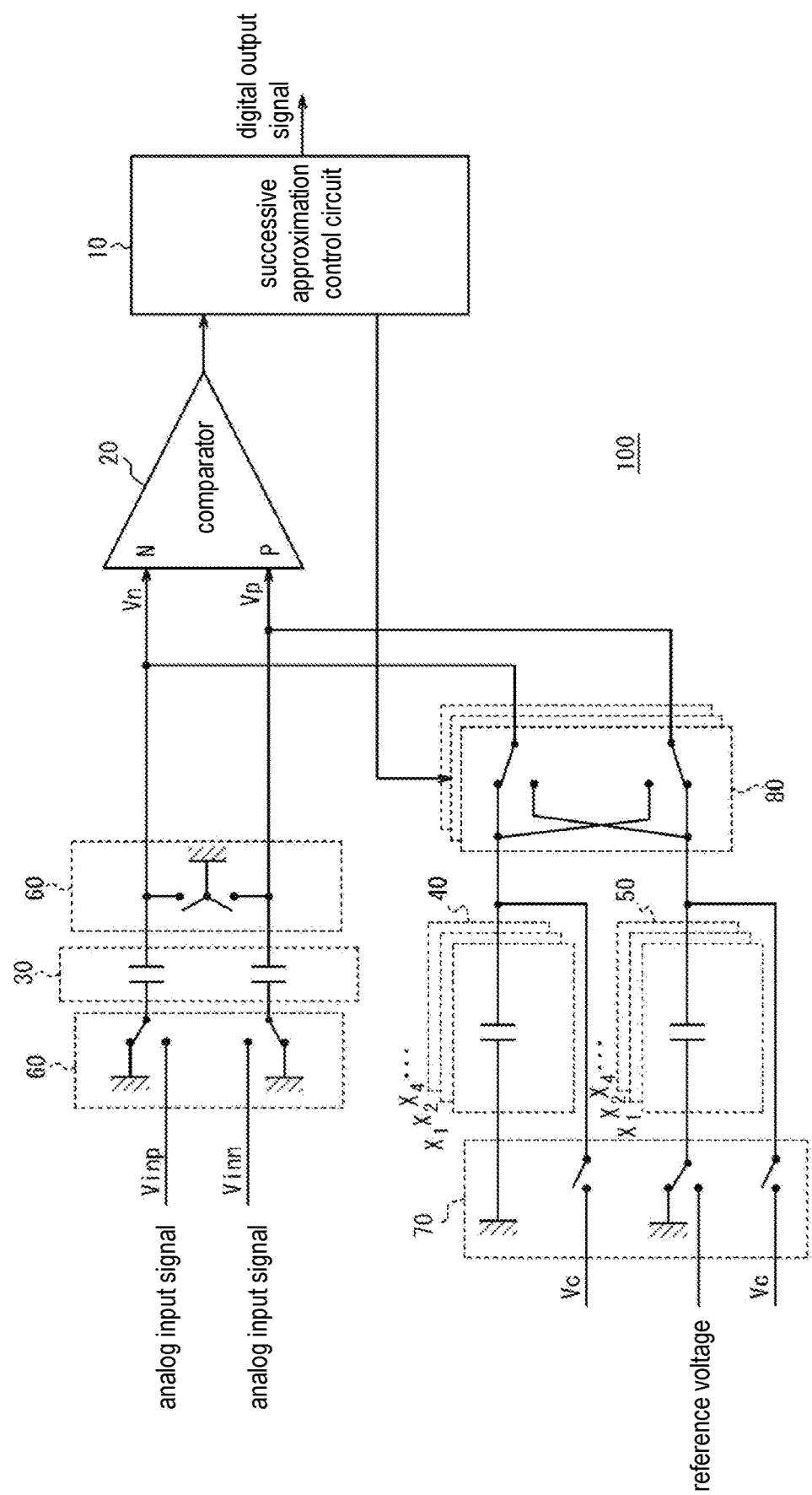
FIG. 11 is a diagram illustrating an example of the configuration of the successive approximation AD converter according to the first embodiment.
Figure 12:
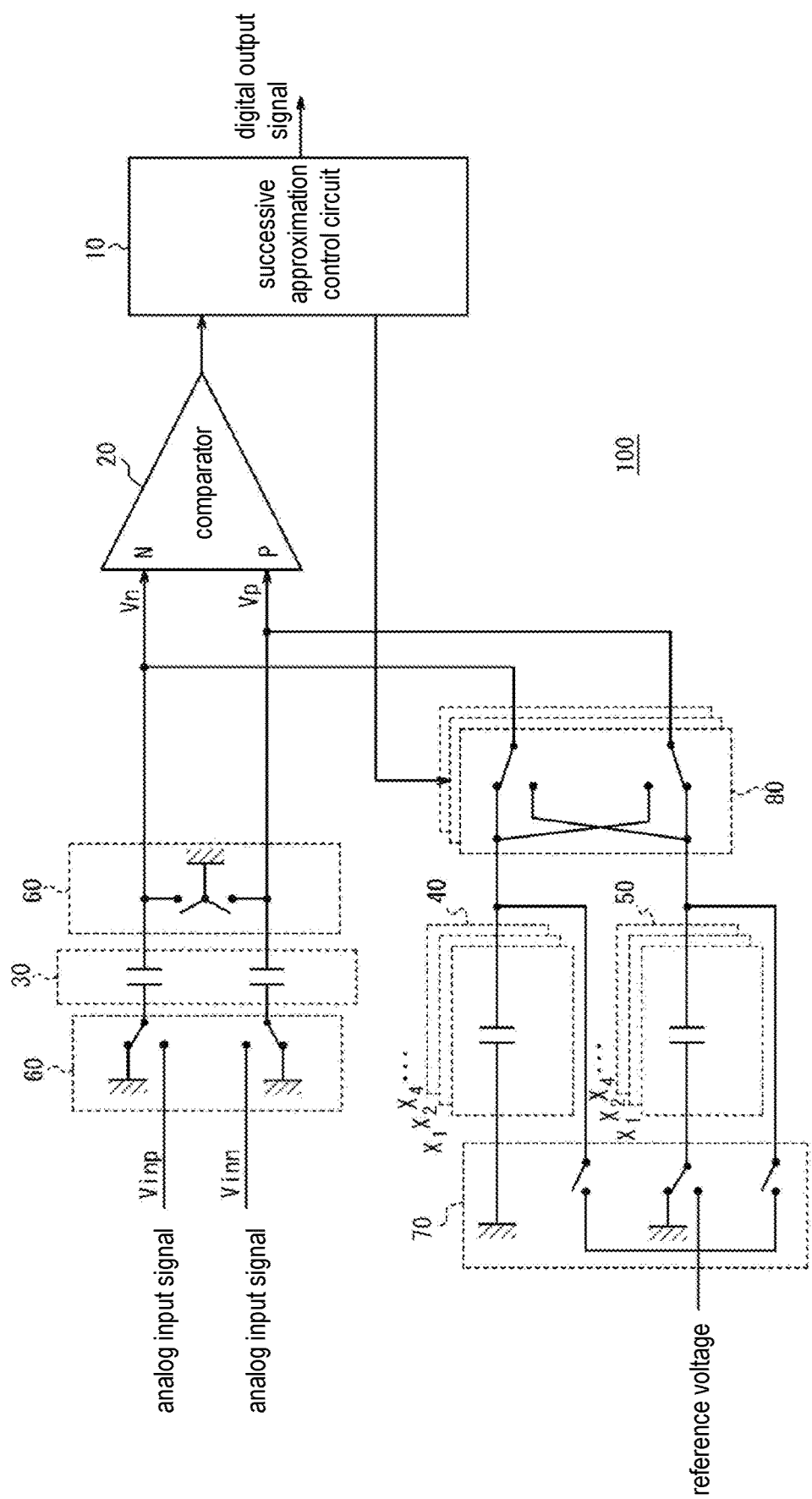
FIG. 12 is a diagram illustrating another example of the configuration of the successive approximation AD converter according to the first embodiment.

FIG. 11 is a diagram illustrating an example of the configuration of the successive approximation AD converter according to the first embodiment. As illustrated in FIG. 11, the first capacitor 30 is coupled to an analog input signal via a switch (switching circuit) 60. The second capacitor group 40 and the third capacitor group 50 are coupled to a reference voltage via a switch (switching circuit) 70. Capacitor terminals which are coupled to an input of the comparator 20 at the time of performing a successive approximation operation out of capacitor terminals of the second capacitor group 40 and the third capacitor group 50 are coupled via a switch 70 to have the same potential. For example, a voltage Vc is applied in FIG. 11, but the capacitor terminals may merely short-circuit as illustrated in FIG. 12.

Circuit operations of the successive approximation AD converter 100 will be sequentially described below for each successive approximation step with reference to FIGS. 13 to 16. For the purpose of simplification, an operation example of the successive approximation AD converter 100 of 3bits will be described below.

Figure 13:
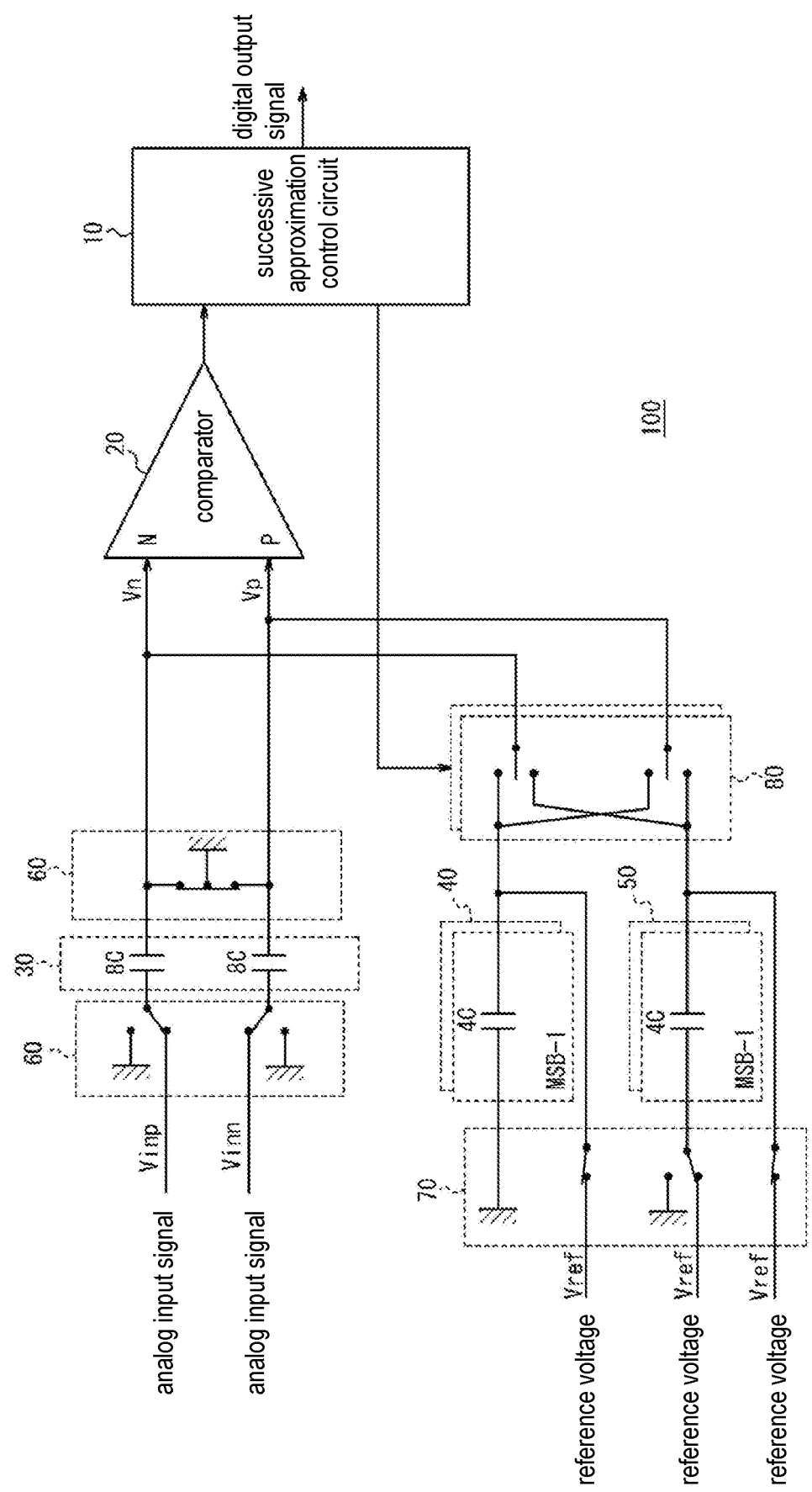
FIG. 13 is a diagram illustrating an example of an operation of a sampling phase in the successive approximation AD converter according to the first embodiment.

FIG. 13 is a diagram illustrating a state in a sampling phase before the successive approximation operation is performed. As illustrated in FIG. 13, in the sampling phase, an analog input is coupled to the first capacitor 30 via a switch 60 and electric charges corresponding to an analog input voltage is stored in the first capacitor 30. On the other hand, a reference voltage is coupled to the second capacitor group 40 and the third capacitor group 50 via the switch 70, and electric charges corresponding to the reference voltage is stored in the second capacitor group 40 and the third capacitor group 50 in advance. The disclosure is characterized in that the capacitor terminals of the second capacitor group 40 and the third capacitor group 50 which are coupled to the input of the comparator 20 have the same potential when the electric charges corresponding to the reference voltage is stored in advance. In the description of the operation, the potential is set to $V_{ref}$ which is equal to the reference voltage.

More specifically, when the analog input voltage is a differential input voltage expressed by $V_{inp}-V_{inn}$, electric charges of $Q_p=-8CV_{inn}$ and $Q_n=-8CV_{inp}$ are stored in the capacitors 30 coupled to the P-side input terminal and the N-side input terminal of the comparator 20.

On the other hand, electric charges of $Q_{ref42}=4CV_{ref}$ is stored in a capacitive element with a greatest weight in the second capacitor group 40, and electric charges of $Q_{ref41}=2CV_{ref}$ is stored in a capacitive element with a second greatest weight in the second capacitor group 40. Electric charges of $Q_{ref52}=4C(V_{ref}-V_{ref})=0$ is stored in a capacitive element with a greatest weight in the third capacitor group 50, and electric charges of $Q_{ref51}=2C(V_{ref}-V_{ref})=0$ is stored in a capacitive element with a second greatest weight in the third capacitor group 50. That is, substantially, electric charges are not stored in the third capacitor group 50 in this embodiment.

Figure 14:
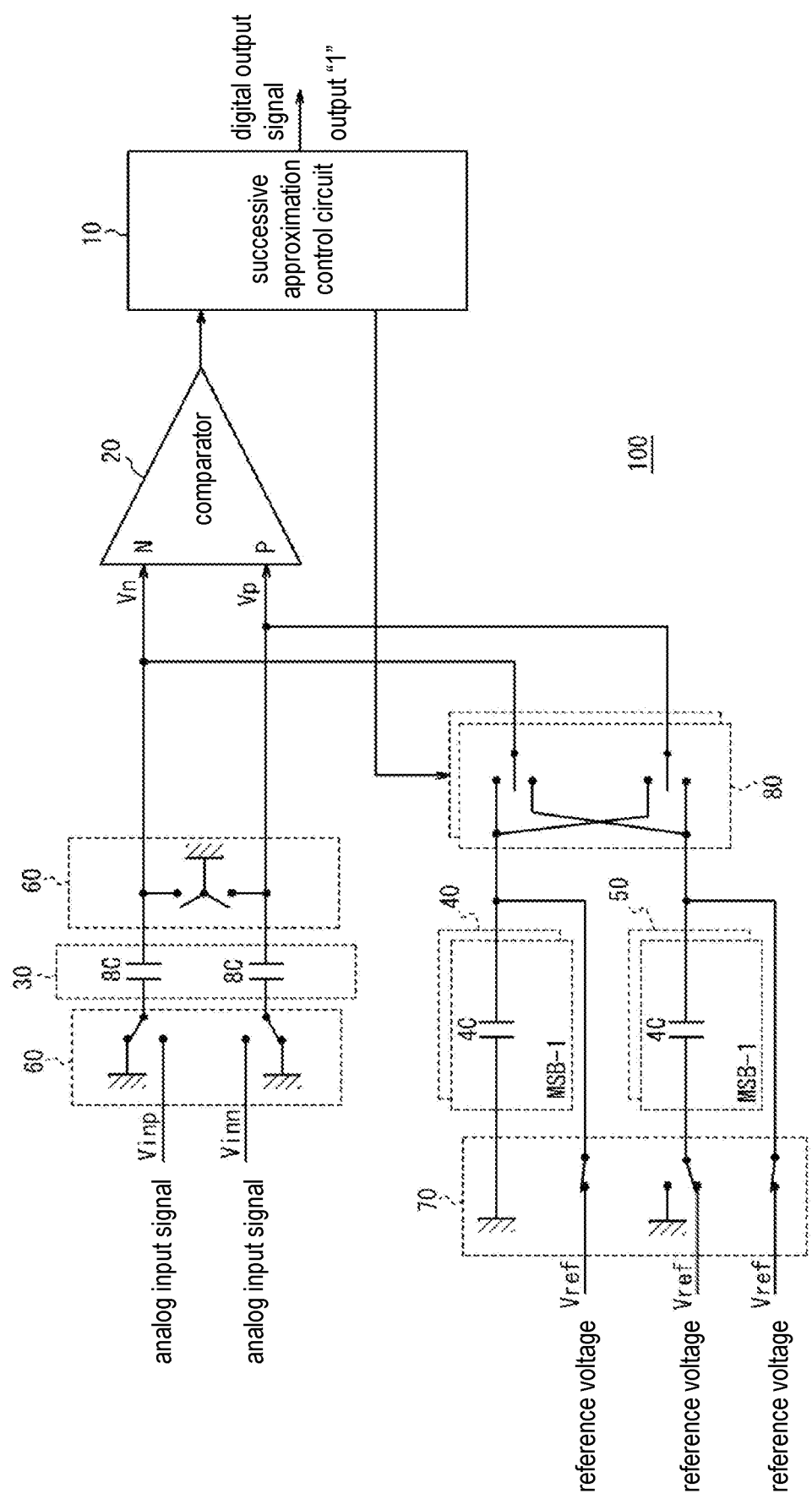
FIG. 14 is a diagram illustrating an example of an operation at the time of determining a most significant bit in the successive approximation AD converter according to the first embodiment.

FIG. 14 is a diagram illustrating a state at the time of determining a most significant bit. As illustrated in FIG. 14, a terminal of the first capacitor 30 which is not coupled to the comparator 20 is coupled to a voltage which is to be a common voltage of the comparator 20. The terminal is coupled to, for example, the ground in FIG. 14.

Here, when the input terminals of the comparator 20 are $V_p$ and $V_n$, a differential input voltage of the comparator 20 is $V_p-V_n=V_{inp}-V_{inn}$. When $V_{inp}-V_{inn}=0.3V_{ref}$ is supposed, the input voltage of the comparator 20 is $V_p-V_n=V_{inp}-V_{inn}=0.3V_{ref}>0$, the comparator 20 generates "1," and the most significant bit is determined to be "1."

Figure 15:
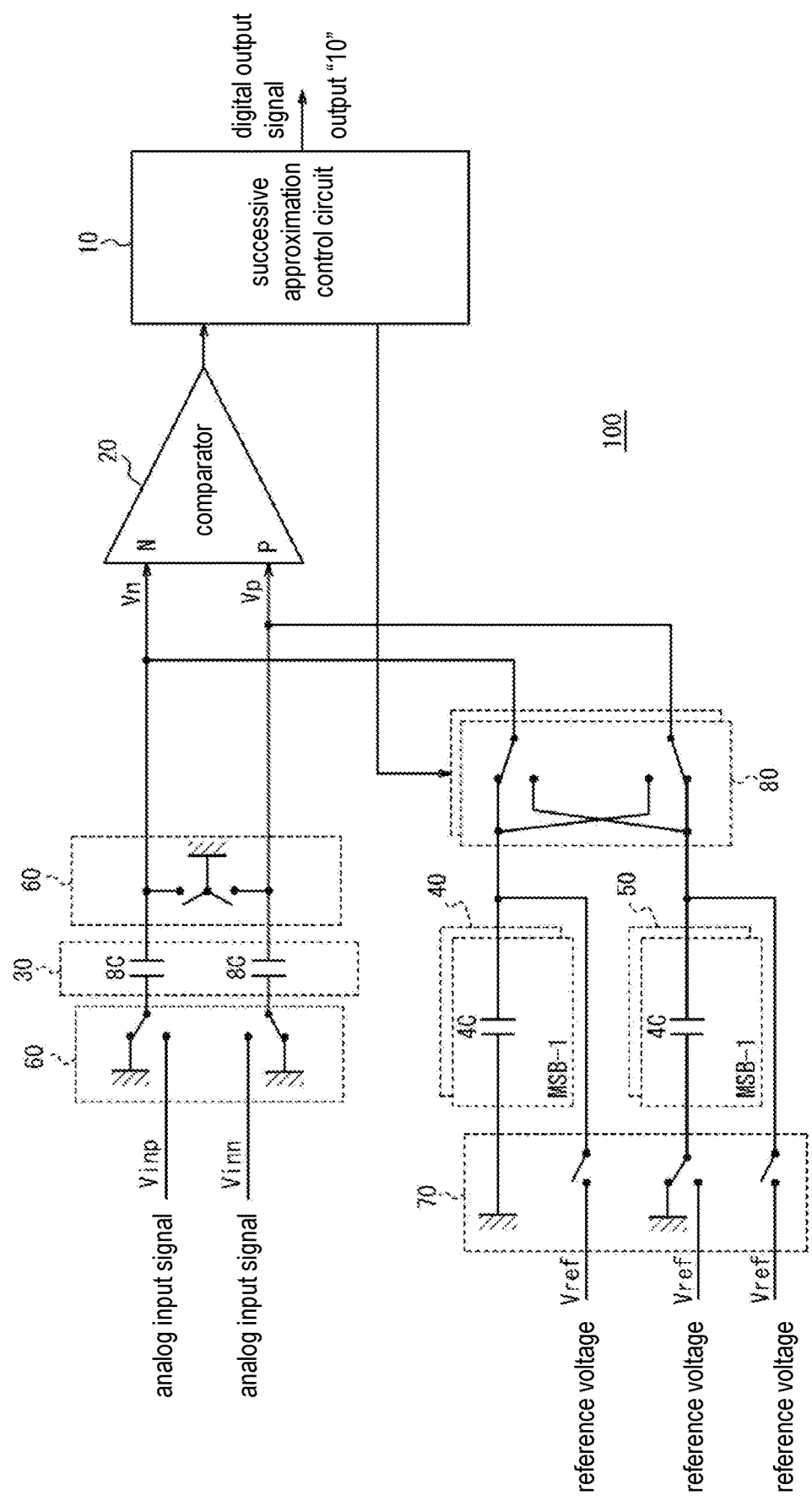
FIG. 15 is a diagram illustrating an example of an operation at the time of determining a second high-order bit in the successive approximation AD converter according to the first embodiment.

FIG. 15 is a diagram illustrating a state at the time of determining a second high-order bit. As illustrated in FIG. 15, the most significant bit is 1, thus a capacitive element with a greatest weight in the second capacitor group 40 is coupled to the N-side input terminal of the comparator 20 via a switch (switching circuit) 80. On the other hand, the most significant bit is 1, thus a capacitive element with a greatest weight in the third capacitor group 50 is coupled to the P-side input terminal of the comparator 20 via the switch 80. More specifically, electric charges of $Q_{ref42}=4CV_{ref}$ which are stored in the sampling phase is applied to the N-side input terminal of the comparator 20 and electric charges of $Q_{ref52}=0$ is applied to the P-side input terminal of the comparator 20.

Accordingly, a total sum of the electric charges $Q_p$ in the P-side input terminal of the comparator 20 and a total sum of the electric charges $Q_n$ in the N-side input terminal of the comparator 20 are $Q_p=-8CV_{inn}$ and $Q_n=-8CV_{inp}+4CV_{ref}$, respectively. The input voltage of the comparator 20 is $V_p-V_n=\{8C(V_{inp}-V_{inn})-4CV_{ref}\}/12C=2/3\{(V_{inp}-V_{inn})-0.5V_{ref}\}$. Here, since $V_{inp}-V_{inn}=0.3V_{ref}$ is supposed, $V_p-V_n=2/3\{0.3V_{ref}-0.5V_{ref}\}<0$ is satisfied, the comparator 20 generates "0," and the second high-order bit is determined to be "0."

Figure 16:
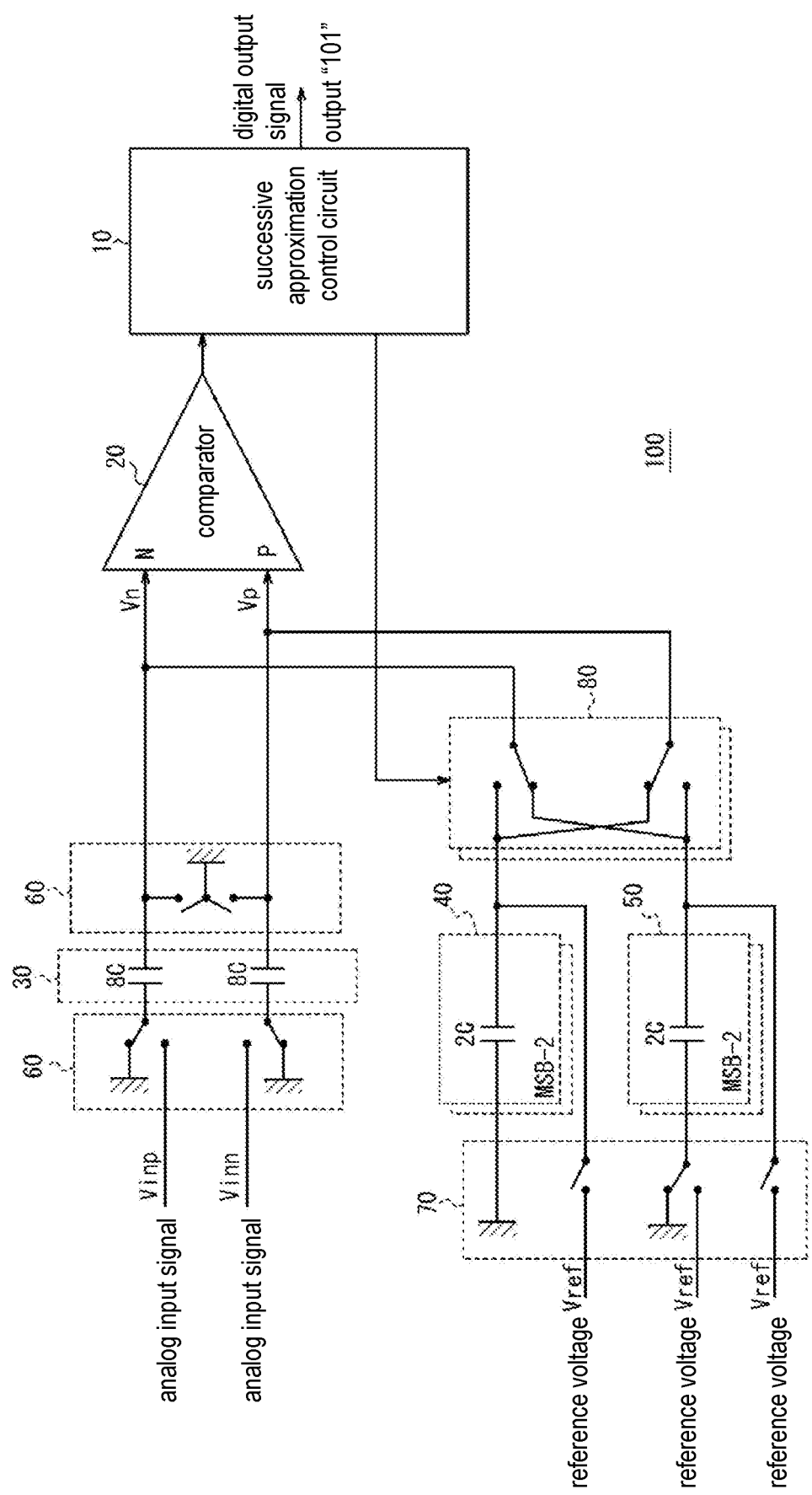
FIG. 16 is a diagram illustrating an example of an operation at the time of determining a third high-order bit in the successive approximation AD converter according to the first embodiment.

FIG. 16 is a diagram illustrating a state at the time of determining a third high-order bit. As illustrated in FIG. 16, the second high-order bit is "0", thus a capacitive element with a second greatest weight in the second capacitor group 40 is coupled to the P-side input terminal of the comparator 20 via the switch 80. On the other hand, the second high-order bit is "0", thus a capacitive element with a second greatest weight in the third capacitor group 50 is coupled to the N-side input terminal of the comparator 20 via the switch 80. More specifically, electric charges of $Q_{ref41}=2CV_{ref}$ which are stored in the sampling phase is applied to the P-side input terminal of the comparator 20 and electric charges of $Q_{ref51}=0$ are applied to the N-side input terminal of the comparator 20. At this time, the capacitive elements with the greatest weight which are coupled at the time of determining the second high-order bit in the second capacitor group 40 and the third capacitor group 50 are kept coupled to the input of the comparator 20.

Accordingly, the total sum of the electric charges $Q_p$ in the P-side input terminal of the comparator 20 and the total sum of the electric charges $Q_n$ in the N-side input terminal of the comparator 20 are $Q_p=-8CV_{inn}+2CV_{ref}$ and $Q_n=-8CV_{inp}+4CV_{ref}$, respectively. The input voltage of the comparator 20 is $V_p-V_n=\{8C(V_{inp}-V_{inn})-2CV_{ref}\}/14C=4/7\{(V_{inp}-V_{inn})-0.25V_{ref}\}$. Here, since $V_{inp}-V_{inn}=0.3V_{ref}$ is supposed, $V_p-V_n=4/7\{0.3V_{ref}-0.25V_{ref}\}>0$ is satisfied, the comparator 20 generates "1," and the third high-order bit is determined to be "1."

Through a series of successive approximation steps described above and illustrated in FIGS. 13 to 16, the analog input signal $V_{inp}-V_{inn}=0.3V_{ref}$ is converted to a digital output "101" in an analog-digital conversion manner. These successive approximation steps may be performed in synchronization with a clock signal which is received from outside. This is because voltage comparison with higher accuracy becomes possible by selecting the clock signal such that a time of one cycle of the clock signal is longer than a time which is consumed in completion of migration of the electric charges.

It will be described below that an AD converter with high accuracy can be provided according to the disclosure even when a parasitic capacitor is present in the second capacitor group 40 and the third capacitor group 50 with reference to FIGS. 17 and 18.

Figure 17:
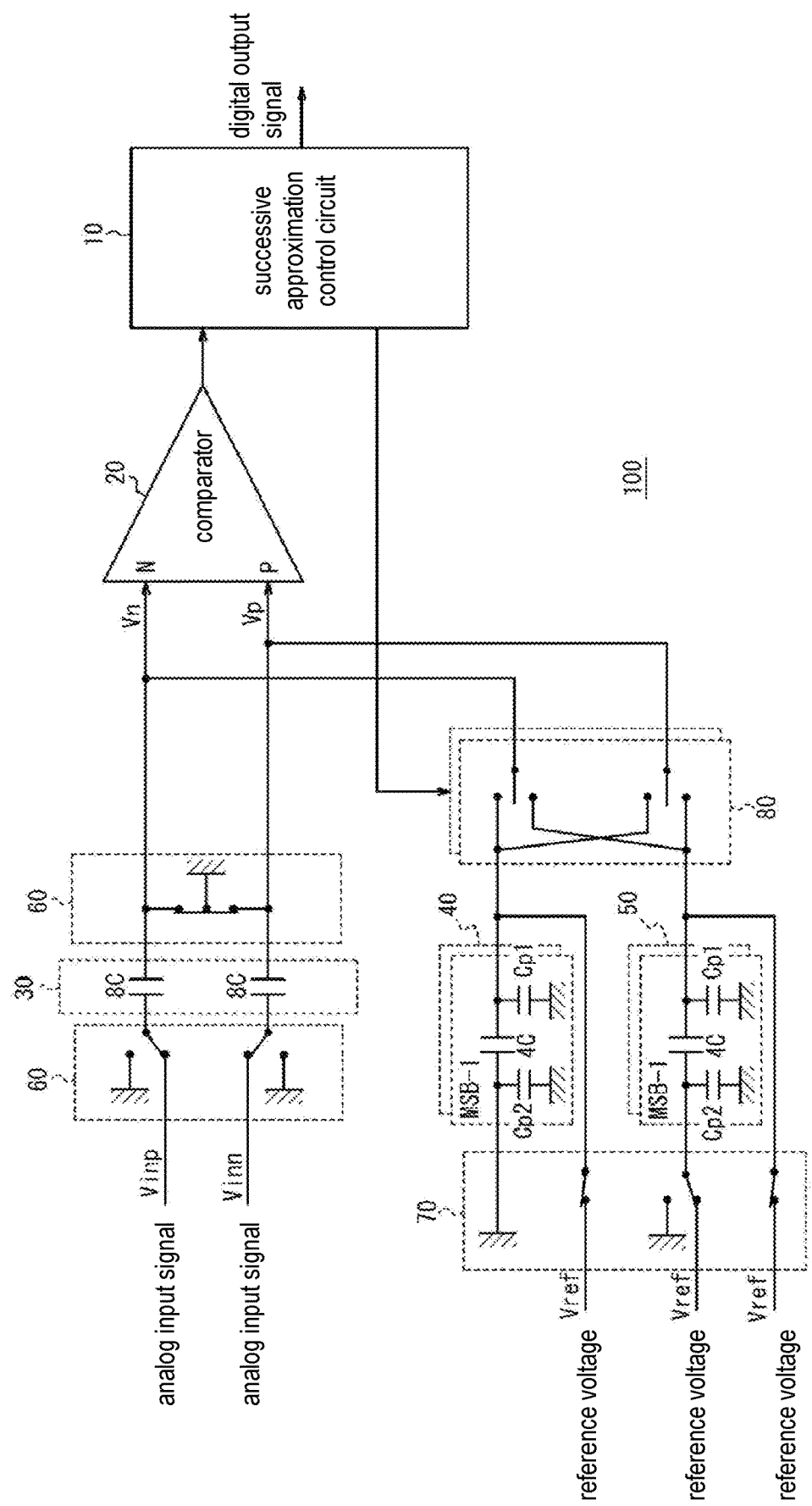
FIG. 17 is a diagram illustrating an example of an operation (with a parasitic capacitance) of the sampling phase in the successive approximation AD converter according to the first embodiment.
Figure 18:
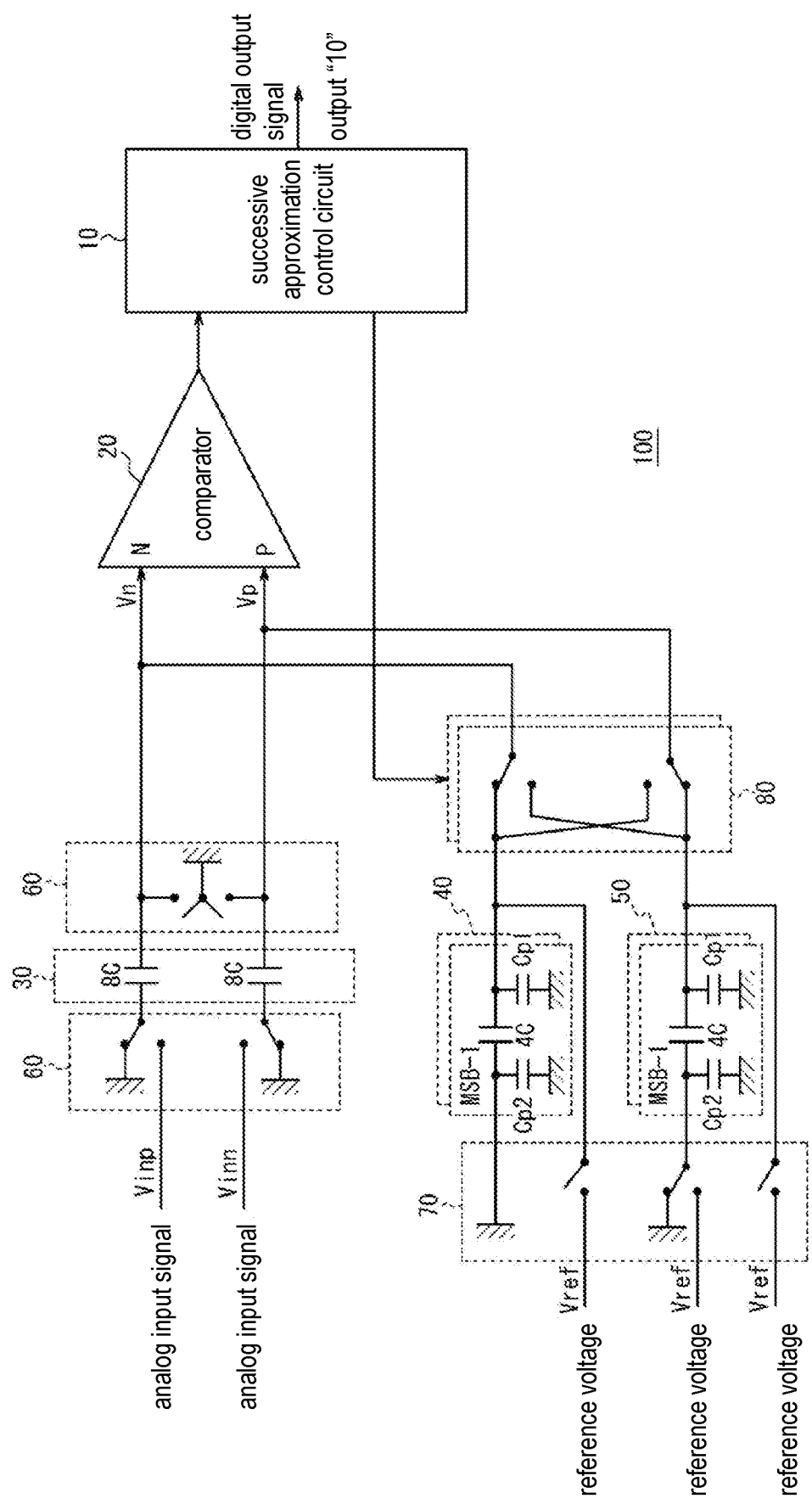
FIG. 18 is a diagram illustrating an example of an operation at the time of determining a second high-order bit in the successive approximation AD converter according to the first embodiment.

As illustrated in FIG. 17, it is assumed that $C_{p1}$ and $C_{p2}$ are added as parasitic capacitors to both ends of each capacitive element of the second capacitor group 40 and $C_{p1}$ and $C_{p2}$ are added as parasitic capacitors to both ends of each capacitive element of the third capacitor group 50. The second capacitor group 40 and the third capacitor group 50 may have the same capacitance value and the same layout (when the capacitive elements are formed on an integrated circuit). This is because the parasitic capacitance values of the second capacitor group 40 and the third capacitor group 50 can be set to be equivalent. Accordingly, the second capacitor group 40 and the third capacitor group 50 may be the same. Here, the "same" means that the second capacitor group 40 and the third capacitor group 50 are the same in shape (layout), material, constituent, and the like as well as in capacitance value.

In the sampling phase, electric charges of $Q_{ref42}=4CV_{ref}$ are stored in the capacitive element with a greatest weight in the second capacitor group 40, and $\Delta Q_1=C_{p1} \cdot V_{ref}$ and $\Delta Q_2=C_{p2} 0=0$ are stored in $C_{p1}$ and $C_{p2}$, respectively. Electric charges of $Q_{ref52}=4C(V_{ref}-V_{ref})=0$ are stored in the capacitive element with the greatest weight in the third capacitor group 50. That is, substantially, electric charges are not stored in the third capacitor group 50 in this embodiment. Electric charges of $\Delta Q_1=C_{p1} \cdot V_{ref}$ and $\Delta Q_2=C_{p2} \cdot V_{ref}$ are stored in $C_{p1}$ and $C_{p2}$.

Thereafter, determination of the most significant bit is not affected by the parasitic capacitors as in the related art. On the other hand, determination of the second high-order bit is affected in the same way as in the related art.

This will be more specifically described below with reference to FIG. 18. electric charges $Q_p$ in the P-side input terminal of the comparator 20 and electric charges $Q_n$ in the N-side input terminal of the comparator 20 at the time of determining the second high-order bit are $Q_p=-8CV_{inn}+C_{p1}V_{ref}$ and $Q_n=-8CV_{inp}+4CV_{ref}+C_{p1}V_{ref}$, respectively. The input voltage of the comparator 20 is $V_p-V_n=\{8C(V_{inp}-V_{inn})-4CV_{ref}+C_{p1}V_{ref}-C_{p1}V_{ref}\}/(12C+C_{p1})=8C/(12C+C_{p1})\{(V_{inp}-V_{inn})-0.5V_{ref}\}$.

As described above, according to the disclosure, since terms which are added in consideration of the parasitic capacitors in the second capacitor group 40 and the third capacitor group 50 are cancelled out, deterioration in linearity of the AD converter due to the parasitic capacitors does not occur in comparison with the related art. In the related art, one capacitor group that stores the reference voltage in advance is prepared and the one capacitor group is coupled to the input terminals of the comparator 20 with a predetermined polarity or an opposite polarity thereof based on a signal from the successive approximation control circuit. On the other hand, according to the disclosure, the aforementioned advantages are achieved based on a distinct structural difference that two capacitor groups that store electric charges corresponding to the reference voltage in advance are prepared, and one thereof is coupled to the P-side input terminal of the comparator 20 and the other thereof is coupled to the N-side input terminal of the comparator 20 based on a signal from the successive approximation control circuit 10.

Figure 19:
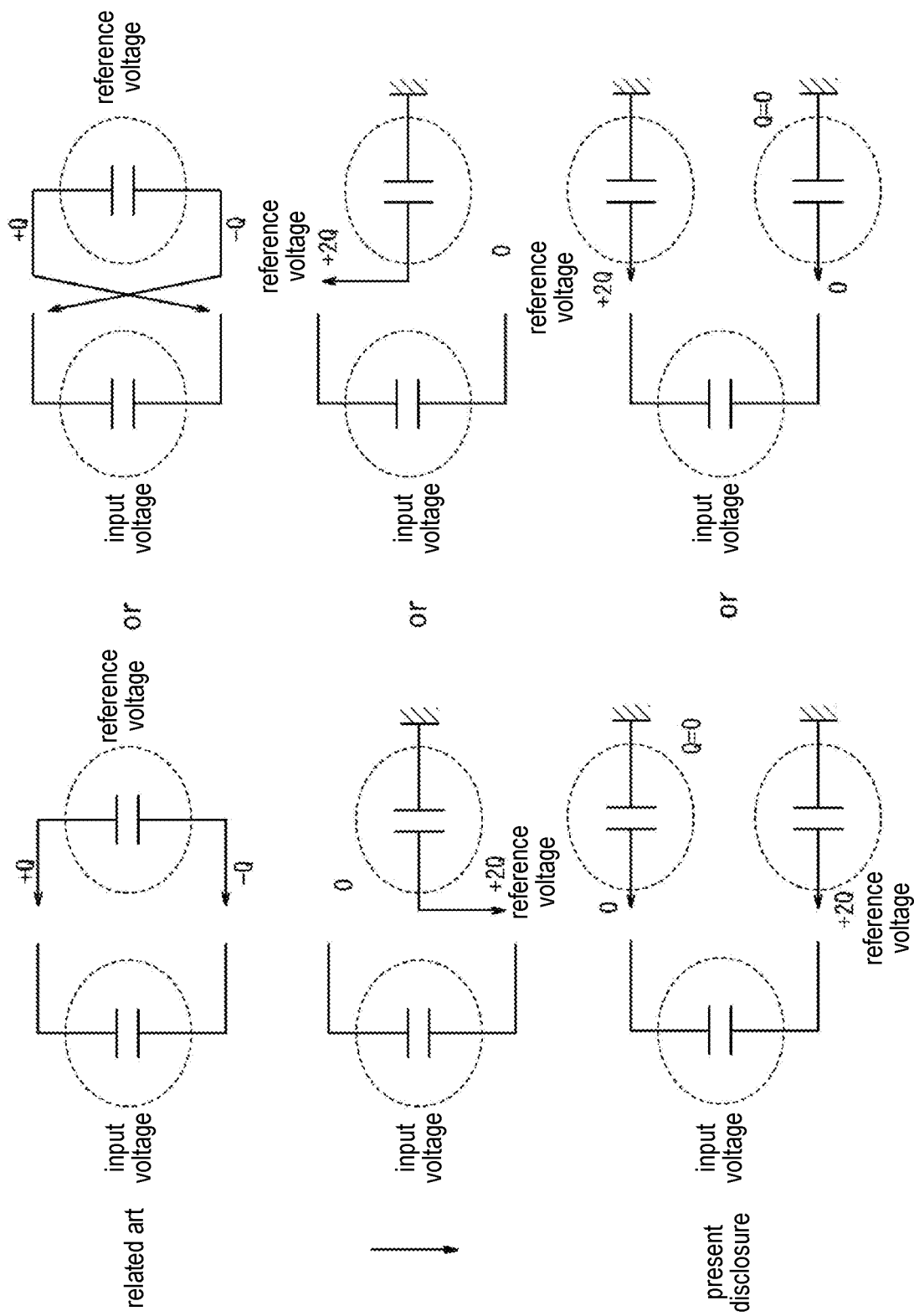
FIG. 19 is a diagram illustrating a difference between the disclosure and the related art.

This difference will be more visually described with reference to FIG. 19. In the related art, when electric charges corresponding to the reference voltage which are stored in the capacitor are coupled to the input of the comparator 20 (which is equivalent to the capacitor storing the input voltage), such connection is performed with a predetermined polarity or the opposite polarity thereof as illustrated in the upper part of FIG. 19. In the disclosure, electric charges corresponding to the reference voltage which are stored in the capacitor are coupled to only one of the input of the comparator 20. In order to cancel out an influence of the parasitic capacitors, another capacitor that does not store electric charges is prepared, and is coupled to the other input of the comparator 20. The disclosure is characterized in that control is performed such that the voltages of the capacitor terminals coupled to the comparator 20 are the same potentials when electric charges corresponding to the reference voltage are stored in advance, whereby an influence of parasitic capacitors is cancelled out.

Second Embodiment

Figure 20:
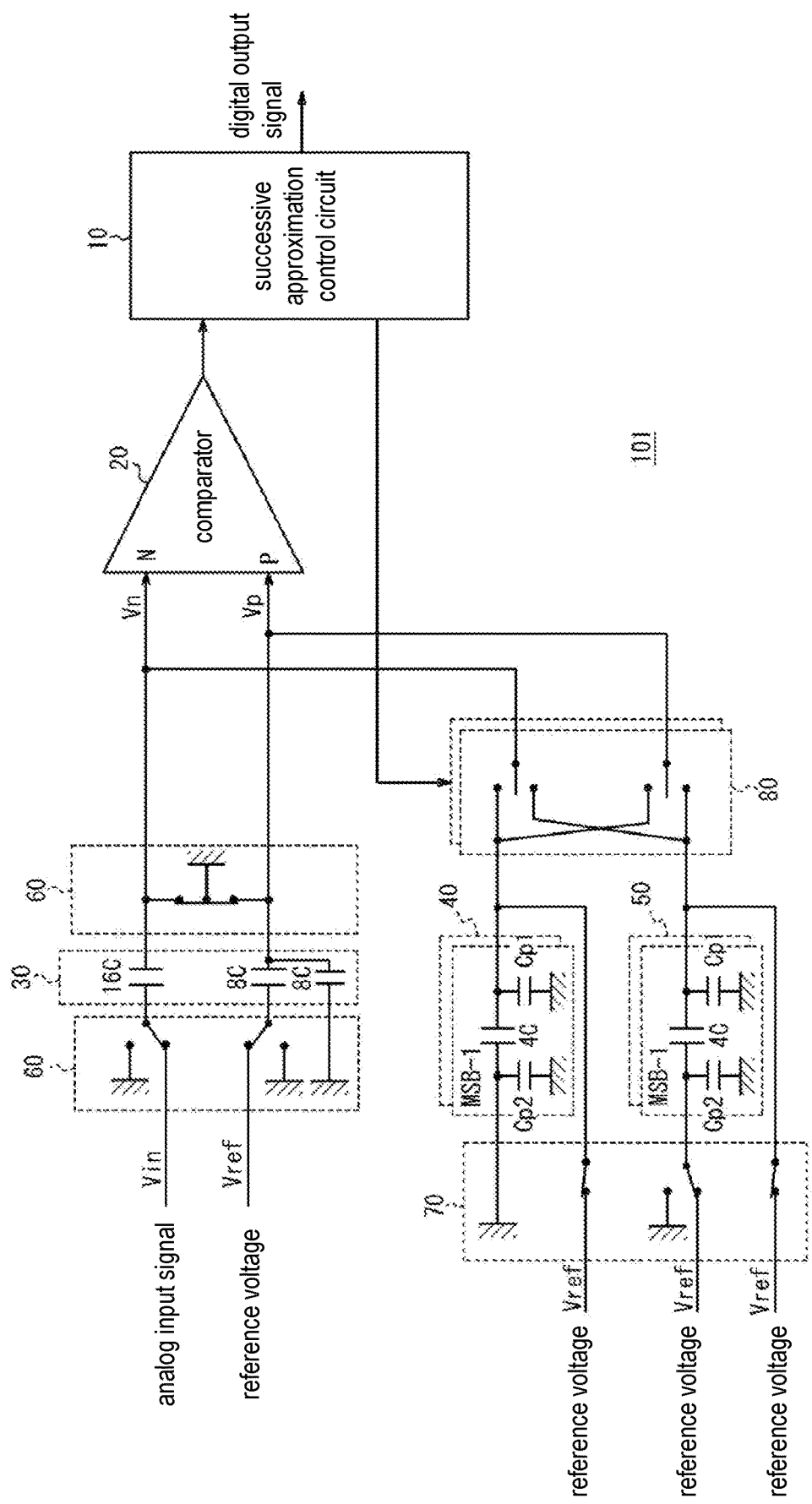
FIG. 20 is a diagram illustrating an example of an operation of a sampling phase in a successive approximation AD converter according to a second embodiment.

FIG. 20 is a diagram schematically illustrating a configuration of a successive approximation AD converter according to a second embodiment. The successive approximation AD converter 101 is a charge sharing type successive approximation AD converter and includes a successive approximation control circuit 10, a comparator 20, a first capacitor 30 that is coupled to an input terminal of the comparator 20, is configured to be able to couple to an analog input signal, and is able to store electric charges in advance, and a second capacitor group 40 and a third capacitor group 50 that are configured to be able to couple to a reference voltage and are able to store electric charges in advance. The second capacitor group 40 and the third capacitor group 50 include a plurality of capacitive elements which is weighted.

The successive approximation control circuit 10 performs control for each successive approximation step such that one of the second capacitor group 40 and the third capacitor group 50 which are weighted is coupled to a P-side input terminal of the comparator 20 and the other is coupled to an N-side input terminal of the comparator 20 based on a determination output result from the comparator 20 for each successive approximation step, and sets the determination output result from the comparator 20 which is sequentially determined as a digital output signal.

The successive approximation AD converter 101 according to this embodiment is different from the successive approximation AD converter 100 according to the first embodiment, in that an analog input signal is a single end signal. A full scale range of the AD converter ranges from $-V_{ref}$ to $+V_{ref}$ in the first embodiment, but ranges from 0 to $+V_{ref}$ in this embodiment.

Circuit operations of the successive approximation AD converter 101 will be sequentially described below for each successive approximation step with reference to FIGS. 20 to 22. For the purpose of simplification, an operation example of the successive approximation AD converter 101 of 3bits will be described below.

FIG. 20 is a diagram illustrating a state in a sampling phase before the successive approximation operation is performed. As illustrated in FIG. 20, in the sampling phase according to this embodiment, an analog input and a reference voltage are coupled to the first capacitor 30 via a switch 60 and electric charges corresponding to an analog input voltage and electric charges corresponding to the reference voltage are stored in the first capacitor 30. The operations of the second capacitor group 40 and the third capacitor group 50 are the same as in the first embodiment and thus description thereof will be omitted. In this embodiment, when the electric charges corresponding to the reference voltage are stored in advance, the electric charges are stored in the second capacitor group 40, and the electric charges are not stored in the third capacitor group 50.

More specifically, when the analog input voltage is a single-end input voltage expressed by $V_{in}$, electric charges of $Q_p=-8CV_{ref}$ and $Q_n=-16CV_{in}$ are stored in the capacitors 30 coupled to the P-side input terminal and the N-side input terminal of the comparator 20.

On the other hand, electric charges of $Q_{ref42}=4CV_{ref}$ are stored in a capacitive element with a greatest weight in the second capacitor group 40, and $\Delta Q_1=C_{p1} \cdot V_{ref}$ and $\Delta Q_2=C_{p2} \cdot 0=0$ are stored in $C_{p1}$ and $C_{p2}$, respectively. The electric charges of $Q_{ref52}=4C(V_{ref}-V_{ref})=0$ are stored in a capacitive element with a greatest weight in the third capacitor group 50. That is, substantially, the electric charges are not stored in the third capacitor group 50 in this embodiment. $\Delta Q_1 = C_{p1} \cdot V_{ref}$ and $\Delta Q_2 = C_{p2} \cdot 0 = 0$ are stored in $C_{p1}$ and $C_{p2}$, respectively.

Figure 21:
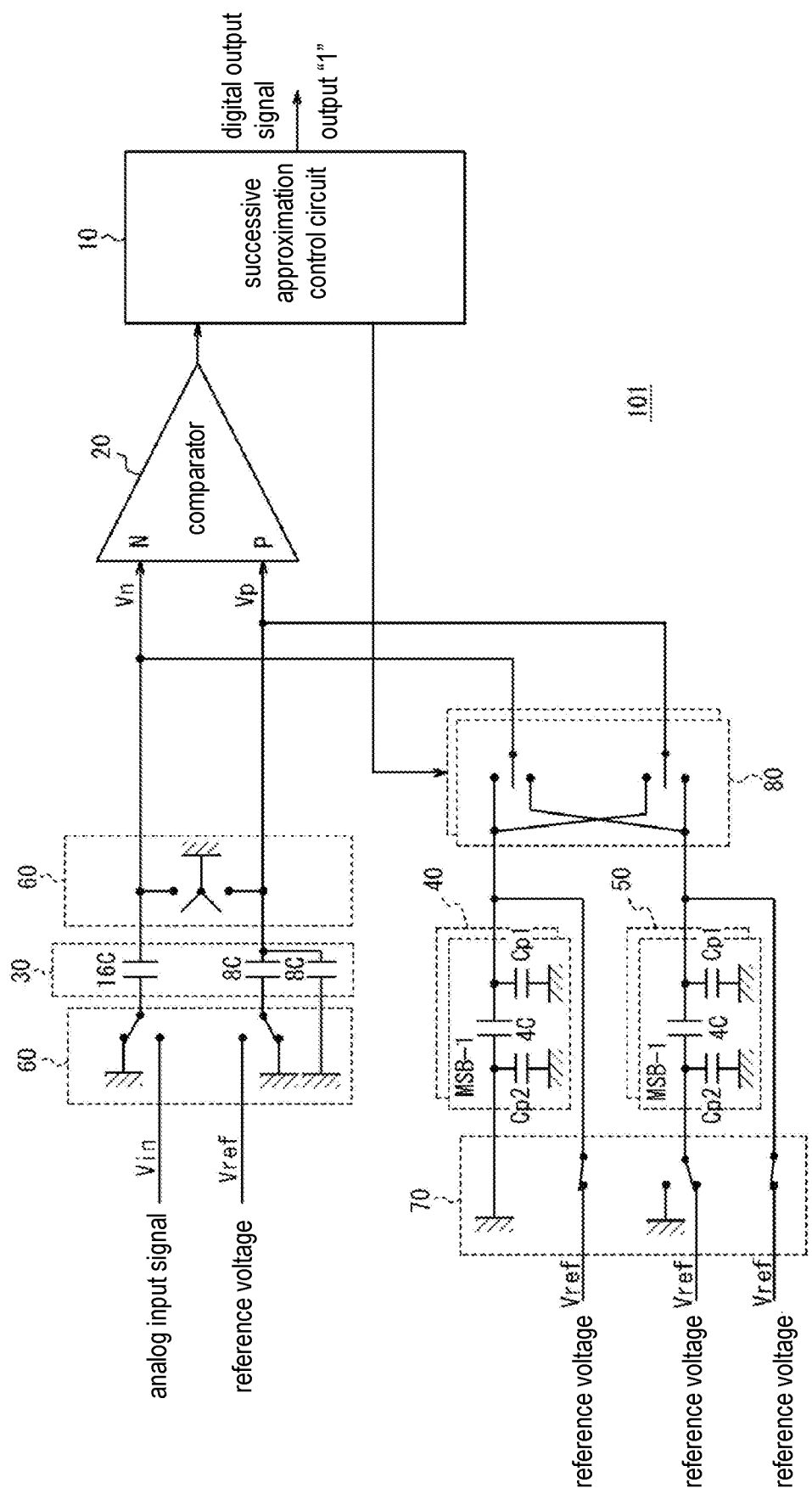
FIG. 21 is a diagram illustrating an example of an operation at the time of determining a most significant bit in the successive approximation AD converter according to the second embodiment.

FIG. 21 is a diagram illustrating a state at the time of determining a most significant bit. As illustrated in FIG. 21, a terminal of the first capacitor 30 which is not coupled to the comparator 20 is coupled to a voltage which is to be a common voltage of the comparator 20. The terminal is coupled to, for example, the ground in FIG. 21. The capacitor on the reference voltage side is configured to have a capacitance value of a half the capacitance value on the analog input voltage side as illustrated in the drawing.

Here, when the input terminals of the comparator 20 are $V_p$ and $V_n$, a differential input voltage of the comparator 20 is $V_p - V_n = V_{in} 310.5 V_{ref}$. When $V_{in} = 0.6 V_{ref}$ is supposed, the input voltage of the comparator 20 is $V_p - V_n = 0.1 V_{ref} > 0$, the comparator 20 generates "1," and the most significant bit is determined to be "1."

Figure 22:
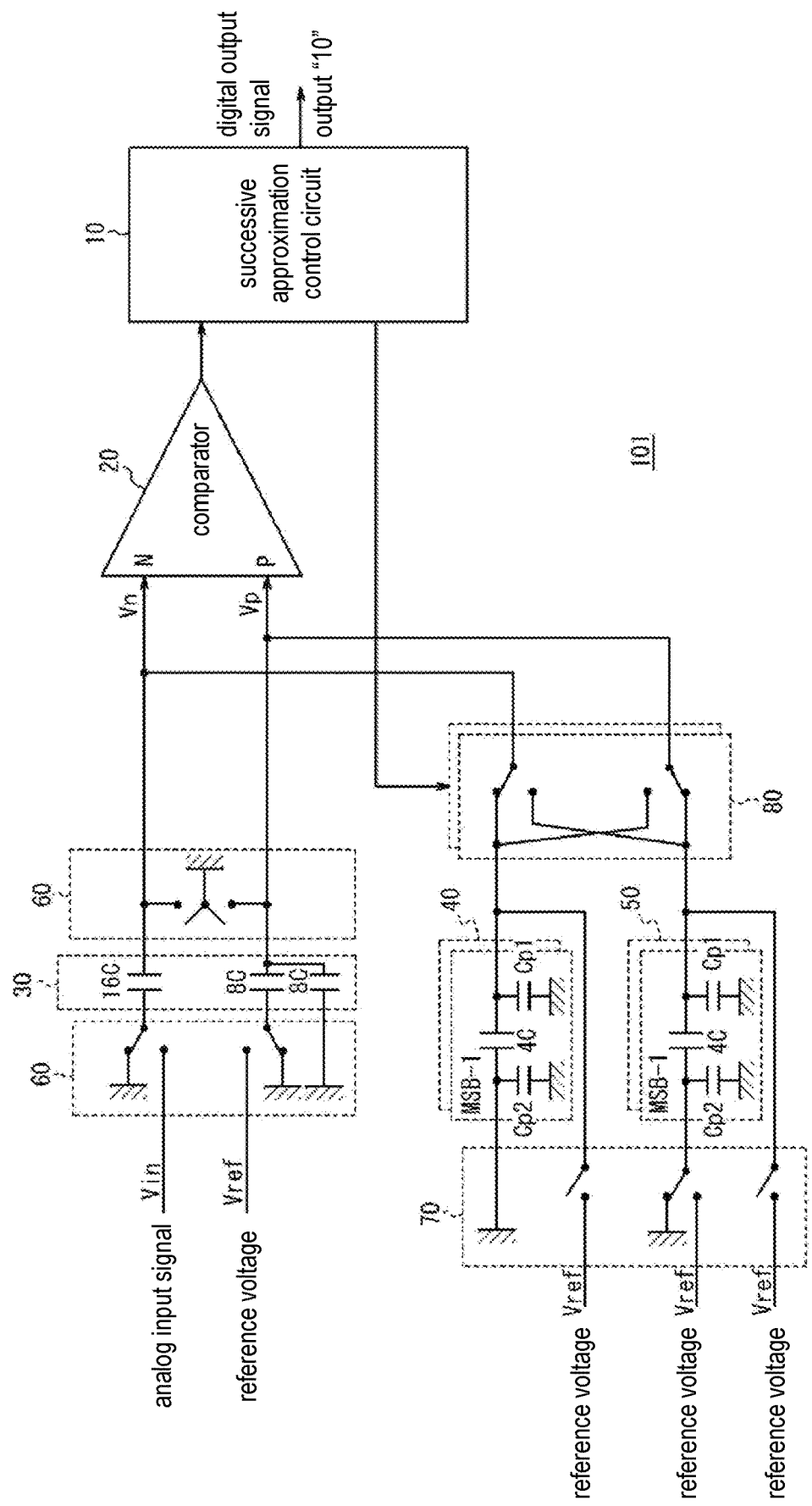
FIG. 22 is a diagram illustrating an example of an operation at the time of determining a second high-order bit in the successive approximation AD converter according to the second embodiment.

FIG. 22 is a diagram illustrating a state at the time of determining a second high-order bit. As illustrated in FIG. 22, the most significant bit is "1", thus a capacitive element with a greatest weight in the second capacitor group 40 is coupled to the N-side input terminal of the comparator 20 via the switch 80. On the other hand, the most significant bit is "1", thus a capacitive element with a greatest weight in the third capacitor group 50 is coupled to the P-side input terminal of the comparator 20 via the switch 80. More specifically, the electric charges of $Q_{ref42} = 4CV_{ref}$ which are stored in the sampling phase is applied to the N-side input terminal of the comparator 20 and the electric charges of $Q_{ref52} = 0$ are applied to the P-side input terminal of the comparator 20.

Accordingly, the total sum of the electric charges $Q_p$ in the P-side input terminal of the comparator 20 and the total sum of the electric charges $Q_n$ in the N-side input terminal of the comparator 20 are $Q_p = -8 V_{ref} + C_{p1} V_{ref}$ and $Q_n = -16 C V_{in} + 4 C V_{ref} + C_{p1} V_{ref}$, respectively. The input voltage of the comparator 20 is $V_p - V_n = (16 C V_{in} - 8 C V_{ref} - 4 C V_{ref} + C_{p1} V_{ref} - C_{p1} V_{ref})/(20 C + C_{p1}) = 16 C/(20 C + C_{p1})(V_{in} - 0.75 V_{ref})$. Here, since $V_{in} = 0.6 V_{ref}$ is supposed, $V_p - V_n = 16 C/(20 C + C_{p1})(0.6 V_{ref} - 0.75 V_{ref}) < 0$ is satisfied, the comparator 20 generates "0," and the second high-order bit is determined to be "0."

As described above, according to this embodiment, since terms which are added in consideration of the parasitic capacitors in the second capacitor group 40 and the third capacitor group 50 are cancelled out, deterioration in linearity of the AD converter due to the parasitic capacitors does not occur. The operations for the third high-order bit or bits subsequent thereto are the same as in the first embodiment and thus description will be omitted.

While the disclosure has been described above with reference to embodiments, the technical scope of the disclosure is not limited to the scopes described in the embodiments. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

It should be noted that the order of performing processes such as operations, sequences, steps, and stages in devices, systems, programs, and methods described in the claims, the specification, and the drawings can be realized in arbitrary order as long as "before," "prior to," or the like is not particularly explicitly described and an output of a previous process is not used for a subsequent process. Even when operation flows in the claims, the specification, and the drawings are described using "first," "then," or the like for the purpose of convenience, it is not essential to perform the operation flows in that order.

What is claimed is:

1. A successive approximation AD converter, comprising:
   a comparator;
   a successive approximation control circuit that generates a digital output signal based on a determination output result from the comparator;
   a first capacitor that is coupled to an input terminal of the comparator, is configured to be able to couple to an analog input signal, and is able to store electric charges in advance; and
   a second capacitor group and a third capacitor group that are configured to be able to couple to a reference voltage and are able to store electric charges in advance,
   wherein the successive approximation control circuit performs controls for each successive approximation step such that one of the second capacitor group and the third capacitor group is coupled to a non-inverting input terminal of the comparator and the other one of the second capacitor group and the third capacitor group is coupled to an inverting input terminal of the comparator based on the determination output result from the comparator for each successive approximation step, and
   wherein the successive approximation control circuit is configured such that a capacitor terminal of the second capacitor group and a capacitor terminal of the third capacitor group which are coupled to the input terminal of the comparator have the same potential when electric charges corresponding to the reference voltage is stored in advance in the second capacitor group and the third capacitor group.

2. The successive approximation AD converter according to claim 1, wherein the electric charges are stored in only the second capacitor group when the reference voltage is stored in advance in the second capacitor group and the third capacitor group.

3. The successive approximation AD converter according to claim 1, wherein the capacitor terminal of the second capacitor group and the capacitor terminal of the third capacitor group which are coupled to the input terminal of the comparator are applied the reference voltage when the electric charges corresponding to the reference voltage is stored in advance in the second capacitor group and the third capacitor group.

4. The successive approximation AD converter according to claim 1, wherein the second capacitor group and the third capacitor group comprise a plurality of capacitive elements which is weighted.

5. The successive approximation AD converter according to claim 1, wherein the second capacitor group and the third capacitor group comprise a plurality of capacitive elements with the same capacitance value.

6. The successive approximation AD converter according to claim 5, wherein the second capacitor group and the third capacitor group are the same.

7. The successive approximation AD converter according to claim 1, wherein the second capacitor group and the third capacitor group comprise a plurality of capacitive elements which is weighted with a power of 2.

8. The successive approximation AD converter according to claim 1, wherein the successive approximation control circuit performs a successive approximation control in synchronization with a clock signal which is externally received.

9. The successive approximation AD converter according to claim 1, further comprising a switching circuit that switches a connection relationship of two ends of the first capacitor, the second capacitor group, and the third capacitor group, wherein the switching circuit switches the connection relationship such that the analog input signal is coupled to one end of the first capacitor and one end of the second capacitor group and one end of the third capacitor group have the same potential in a first period.

10. The successive approximation AD converter according to claim 9, wherein the switching circuit couples the one end of the second capacitor group and the one end of the third capacitor group to the reference voltage in the first period.

11. The successive approximation AD converter according to claim 9, wherein the switching circuit couples the one end of the second capacitor group and the one end of the third capacitor group in the first period.

* * * * *